(12) United States Patent
Oowada

(10) Patent No.: US 8,339,142 B2
(45) Date of Patent: Dec. 25, 2012

(54) SYSTEM FOR DIAGNOSING SENSORS TO FIND OUT ABNORMALITY THEREIN

(75) Inventor: Takahumi Oowada, Kariya (JP)

(73) Assignee: Denso Corporation, Kariya (JP)

( * ) Notice: Subject to any disclaimer, the term of this patent is extended or adjusted under 35 U.S.C. 154(b) by 181 days.

(21) Appl. No.: 13/011,256

(22) Filed: Jan. 21, 2011

(65) Prior Publication Data

US 2011/0181292 A1 Jul. 28, 2011

(30) Foreign Application Priority Data

Jan. 22, 2010 (JP) ................................. 2010-012004

(51) Int. Cl.
*G01R 31/02* (2006.01)

(52) U.S. Cl. ........ 324/537; 324/511; 324/546; 324/500; 324/545; 324/765.01; 361/23; 361/24; 361/25; 361/26; 318/759; 318/760; 318/761; 318/762

(58) Field of Classification Search .................. 324/511, 324/537, 546, 500, 545, 765.01; 361/23–26; 318/759–762

See application file for complete search history.

(56) References Cited

U.S. PATENT DOCUMENTS

| | | | | |
|---|---|---|---|---|
| 3,970,897 A | * | 7/1976 | Tamir et al. | 361/23 |
| 4,590,413 A | * | 5/1986 | Gritter et al. | 318/803 |
| 4,851,766 A | * | 7/1989 | Shiobara et al. | 324/765.01 |
| 4,965,504 A | * | 10/1990 | Ueda et al. | 318/802 |
| 5,066,899 A | * | 11/1991 | Nashiki | 318/807 |
| 5,091,839 A | * | 2/1992 | Gaul et al. | 363/41 |
| 5,357,181 A | * | 10/1994 | Mutoh et al. | 318/139 |
| 5,374,885 A | * | 12/1994 | Kuppers et al. | 318/757 |
| 5,592,355 A | * | 1/1997 | Ikkai et al. | 361/94 |
| 5,677,611 A | | 10/1997 | Yoshihara et al. | |
| 5,726,997 A | * | 3/1998 | Teene | 714/726 |
| 5,836,156 A | * | 11/1998 | Watabe et al. | 60/276 |
| 6,265,891 B1 | * | 7/2001 | Yamada et al. | 324/765.01 |
| 6,675,108 B2 | * | 1/2004 | Fedirchuk et al. | 702/33 |
| 6,803,736 B1 | * | 10/2004 | Hommel et al. | 318/567 |

(Continued)

FOREIGN PATENT DOCUMENTS

JP 09-023501 1/1997

(Continued)

OTHER PUBLICATIONS

Dobrucky et al., "Instantaneous Single-Phase Sytem Power Demonstration Using Virtual Two Phase Theory", International School on Nonsinusoidal Currents and Compensation, pp. 1-5 (2008).*

*Primary Examiner* — Timothy J Dole
*Assistant Examiner* — Lamarr Brown
(74) *Attorney, Agent, or Firm* — Nixon & Vanderhye PC

(57) ABSTRACT

In an abnormality diagnosing system for first and second current sensors for measuring a current, an obtaining unit obtains at least one pair of measured values of the first and second current sensors. The at least one pair of measured values is measured by the first and second current sensors at a substantially same timing. A diagnosing unit diagnoses whether there is an abnormality in at least one of the first and second current sensors based on a function defining a relationship between the at least one pair of measured values of the first and second current sensors.

31 Claims, 19 Drawing Sheets

U.S. PATENT DOCUMENTS

| | | | |
|---|---|---|---|
| 7,042,229 B2 * | 5/2006 | Lee et al. | 324/551 |
| 7,231,319 B2 * | 6/2007 | Dimino et al. | 702/185 |
| 7,275,003 B2 * | 9/2007 | Koh | 702/65 |
| 7,538,512 B2 * | 5/2009 | Discenzo | 318/609 |
| 7,646,160 B2 * | 1/2010 | Chen et al. | 318/490 |
| 8,129,928 B2 * | 3/2012 | Shoda et al. | 318/135 |
| 8,253,365 B2 * | 8/2012 | Yeh | 318/490 |
| 2007/0076334 A1 * | 4/2007 | Battani et al. | 361/23 |
| 2009/0107256 A1 * | 4/2009 | Jensen | 73/862 |
| 2010/0194319 A1 * | 8/2010 | Ito et al. | 318/400.13 |
| 2010/0217546 A1 * | 8/2010 | Locker | 702/58 |
| 2011/0025369 A1 * | 2/2011 | Quarto | 324/765.01 |

FOREIGN PATENT DOCUMENTS

| | | |
|---|---|---|
| JP | P2001-112295 A | 4/2001 |
| JP | 2005-160136 | 6/2005 |

* cited by examiner

FIG.6
(a)
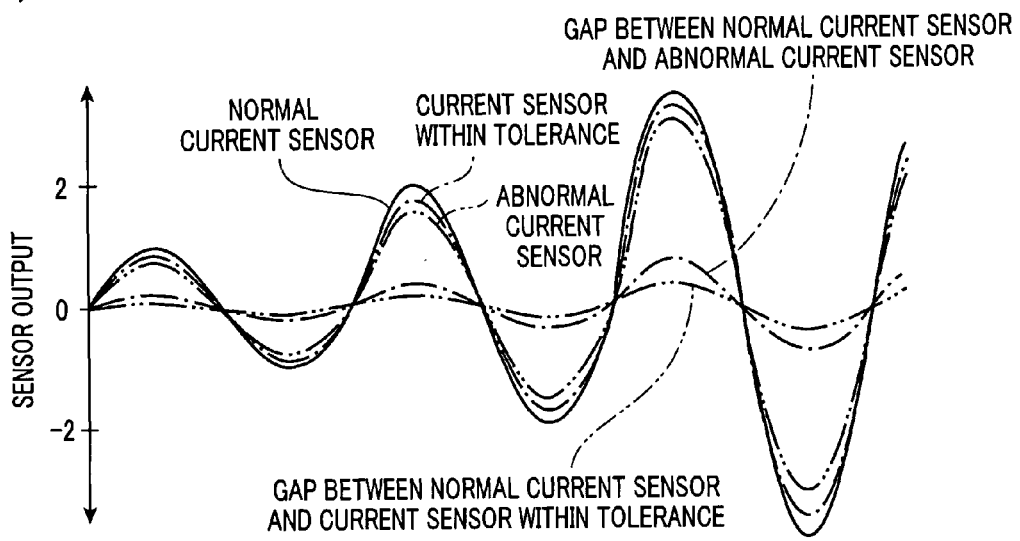
(b)
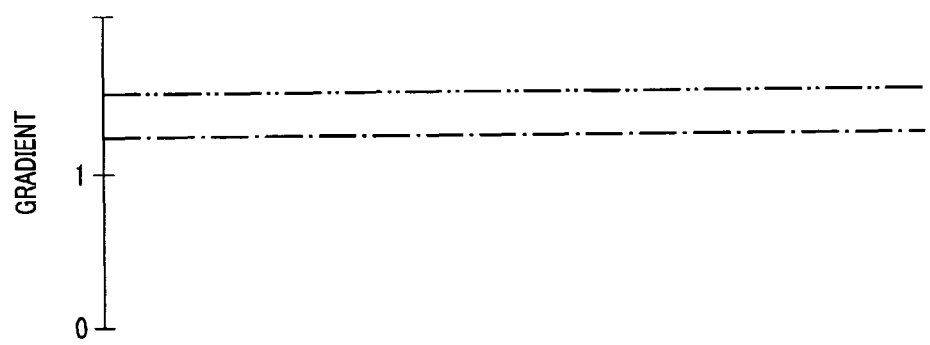

FIG.18
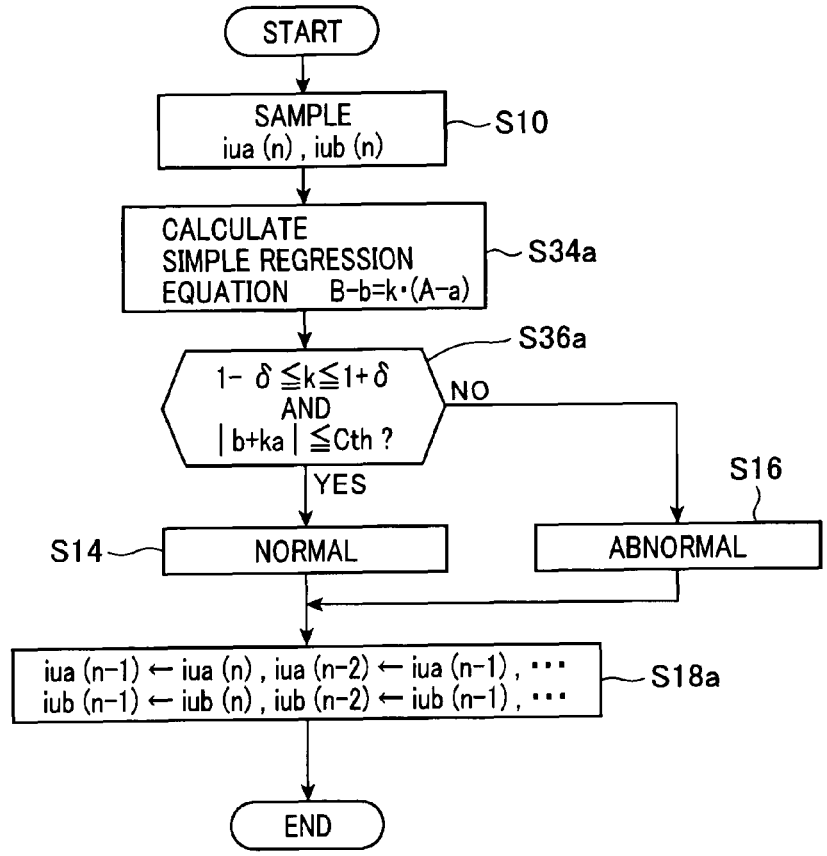
FIG.19
(a)
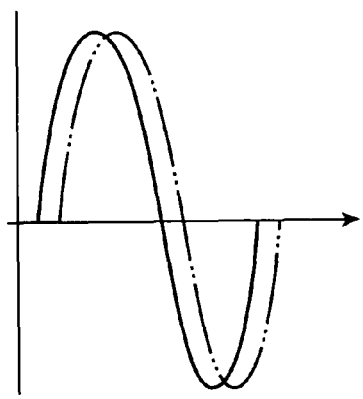
(b)
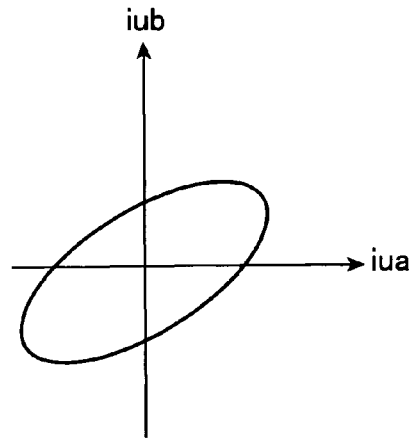

SYSTEM FOR DIAGNOSING SENSORS TO FIND OUT ABNORMALITY THEREIN

CROSS REFERENCE TO RELATED APPLICATIONS

This application is based on Japanese Patent Application 2010-12004 filed on Jan. 22, 2010. This application claims the benefit of priority from the Japanese Patent Application, so that the descriptions of which are all incorporated herein by reference.

TECHNICAL FIELD

The present disclosure relates to systems for diagnosing current sensors for sensing current flowing in devices, such as rotary machines, and to systems for diagnosing a plurality of sensors for sensing a physical quantity associated with a common target.

BACKGROUND

A type of such diagnostic systems is for example disclosed in U.S. Pat. No. 5,677,611 corresponding to Japanese Patent Application Publication No. H09-23501. A diagnostic system of this type is designed to diagnose that there is an abnormality in a current sensor if the output of the current sensor is zero during a preset period of time. A diagnostic system of another type is disclosed in Japanese Patent Application Publication No. 2005-160136.

SUMMARY

The inventor has discovered that there is a problem in the type of diagnostic systems disclosed in U.S. Pat. No. 5,677,611.

Various abnormalities may occur in current sensors. For example, an abnormality due to reduction in the sensitiveness of a current sensor to the change in current actually flowing through a target may occur in the current sensor. An abnormality due to the difference between an actual value of current flowing through a target and a measured current value of a current sensor may occur in the current sensor.

However, because the type of diagnostic systems disclosed in U.S. Pat. No. 5,677,611 can diagnose that there is an abnormality in a current sensor only when the output of the current sensor is kept unchanged, it cannot diagnose various abnormalities set forth above except for abnormalities due to unchanged output.

In view of the circumstances set forth above, the present invention seeks to provide systems for diagnosing current sensors, these systems are designed to address the problem in the type of diagnostic systems disclosed in U.S. Pat. No. 5,677,611.

Specifically, the present invention aims to allow such diagnostic systems to diagnose whether there are various abnormalities except for abnormalities due to unchanged output in current sensors.

In addition, the present invention aims to provide systems for effectively diagnosing a plurality of sensors for sensing a physical quantity associated with a common target.

According to one aspect of the present invention, there is provided an abnormality diagnosing system for first and second current sensors for measuring a current. The abnormality diagnosing system includes an obtaining unit configured to obtain at least one pair of measured values of the first and second current sensors. The at least one pair of measured values is measured by the first and second current sensors at a substantially same timing. The abnormality diagnosing system includes a diagnosing unit configured to diagnose whether there is an abnormality in at least one of the first and second current sensors based on a function defining a relationship between the at least one pair of measured values of the first and second current sensors.

If the first and second current sensors are normal, the function defining the relationship between the at least one pair of measured values of the first and second current sensors is estimated to be a specific function. If an abnormality has occurred in at least one of the first and second current sensors, there is a specific feature in the function defining the relationship between the at least one pair of measured values of the first and second current sensors; this specific feature does not appear in the specific function. Thus, the abnormality diagnosing system can diagnose whether there is an abnormality in at least one of the first and second current sensors based on the function defining the relationship between the at least one pair of measured values of the first and second current sensors.

Note that the "substantially same timing" does not mean a "strictly matched timing". That is even if a timing at which a value is measured by the first current sensor and a timing at which a value is measured by the second current sensor have a time lag due to a difference in, for example, performance between the first current sensor and the second current sensor, this case can be included in the "substantially same timing".

According to another aspect of the present invention, there is provided an abnormality diagnosing system for first and second sensors for measuring a physical quantity associated with a common target. The abnormality diagnosing system includes an obtaining unit configured to obtain at least one pair of measured values of the first and second sensors. The at least one pair of measured values is measured by the first and second sensors at a substantially same timing. The abnormality diagnosing system includes a diagnosing unit configured to diagnose whether there is an abnormality in at least one of the first and second sensors based on a function defining a relationship between the at least one pair of measured values of the first and second sensors.

If the first and second sensors are normal, the function defining the relationship between the at least one pair of measured values of the first and second sensors is estimated to be a specific function. If an abnormality has occurred in at least one of the first and second sensors, there is a specific feature in the function defining the relationship between the at least one pair of measured values of the first and second sensors; this specific feature does not appear in the specific function. Thus, the abnormality diagnosing system can diagnose whether there is an abnormality in at least one of the first and second sensors based on the function defining the relationship between the at least one pair of measured values of the first and second sensors.

Note that the "substantially same timing" does not mean a "strictly matched timing". That is, even if a timing at which a value is measured by the first sensor and a timing at which a value is measured by the second sensor have a time lag due to a difference in, for example, performance between the first sensor and the second sensor, this case can be included in the "substantially same timing".

The above and/or other features, and/or advantages of various aspects of the present invention will be further appreciated in view of the following description in conjunction with the accompanying drawings. Various aspects of the present invention can include and/or exclude different features, and/or advantages where applicable. In addition, various aspects of the present invention can combine one or more feature of other embodiments where applicable. The descriptions of features, and/or advantages of particular embodiments should not be constructed as limiting other embodiments or the claims.

BRIEF DESCRIPTION OF THE DRAWINGS

Other aspects of the invention will become apparent from the following description of embodiments with reference to the accompanying drawings in which.

Figure 4:
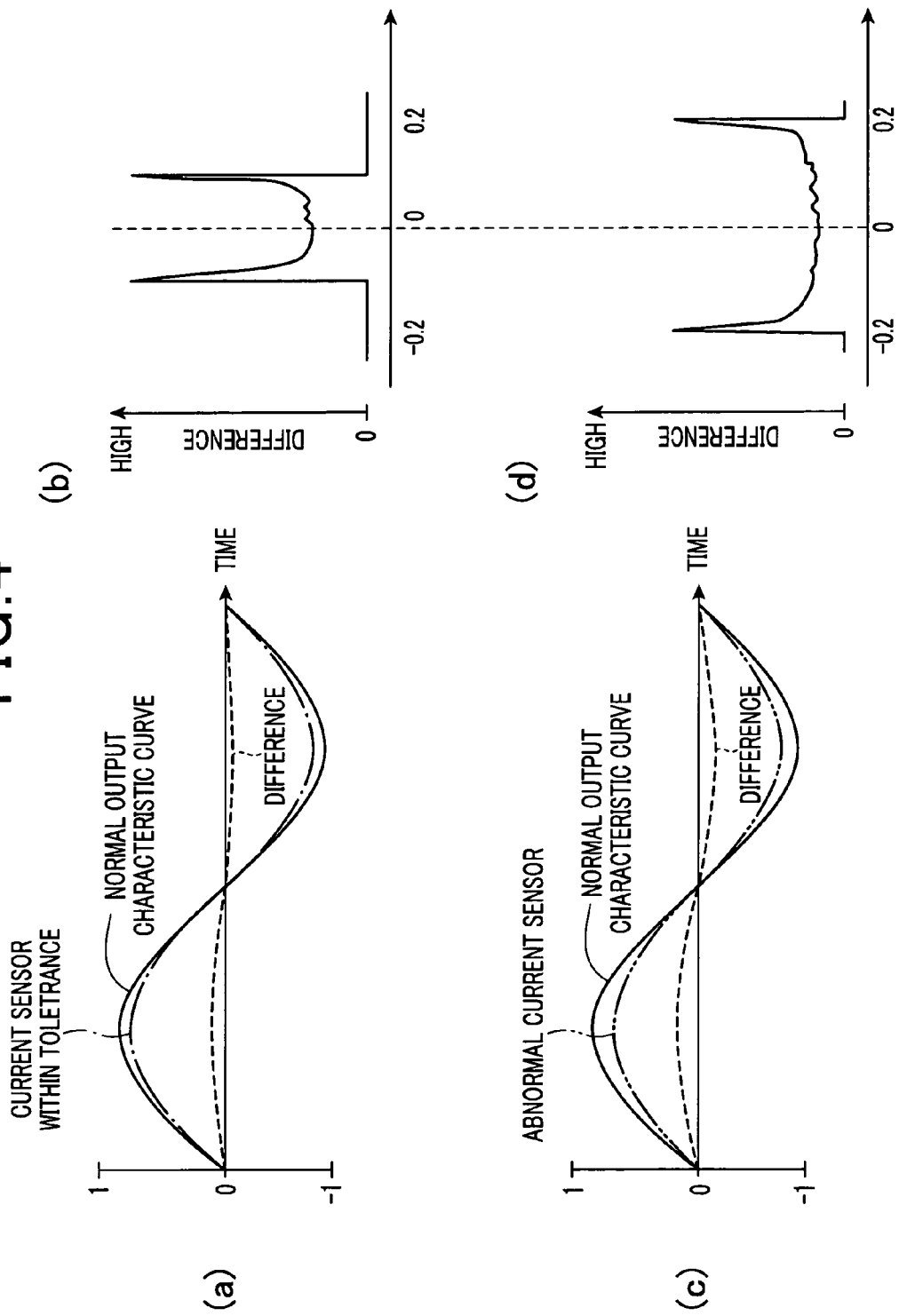
Figure 5:
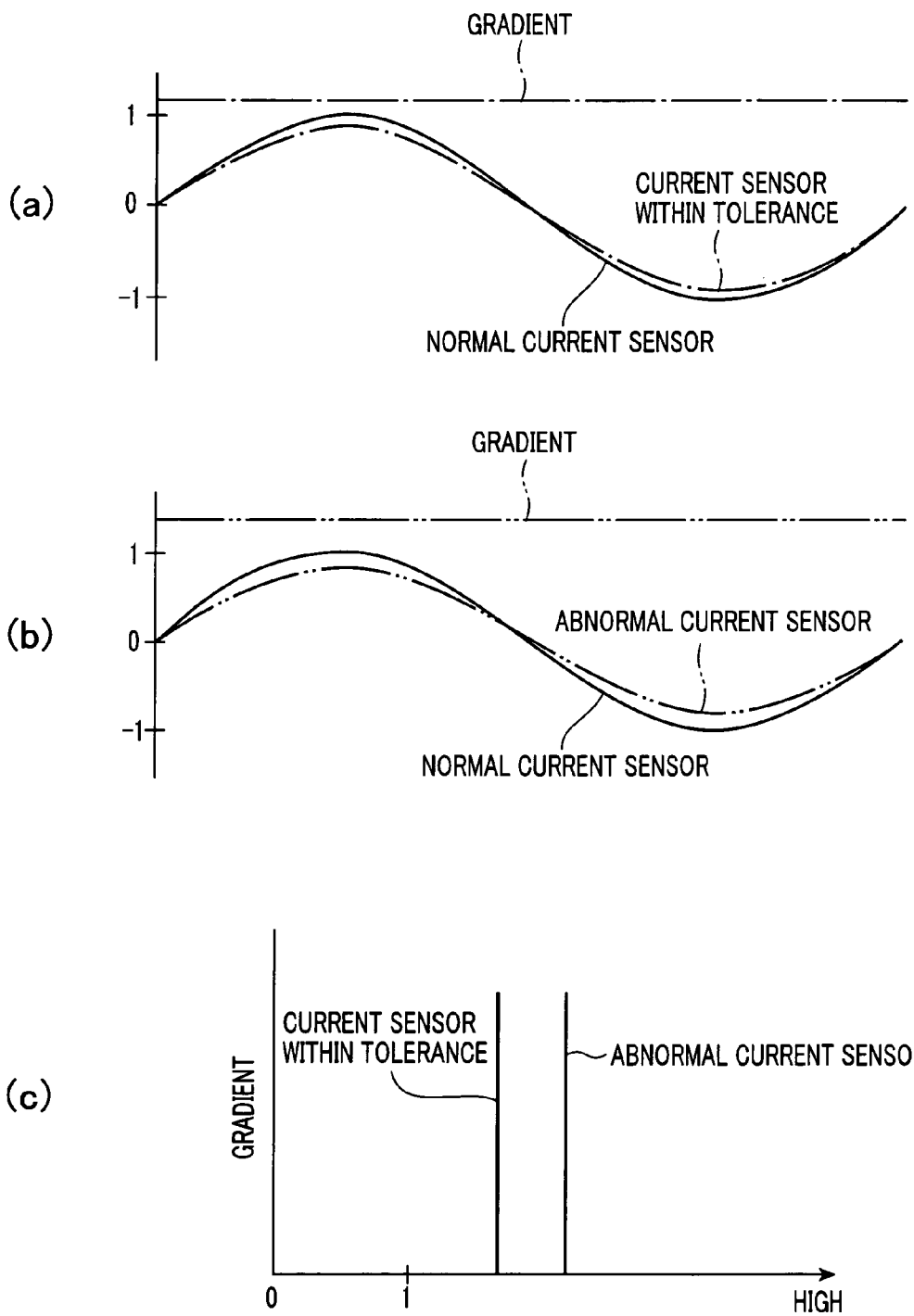
Figure 7:
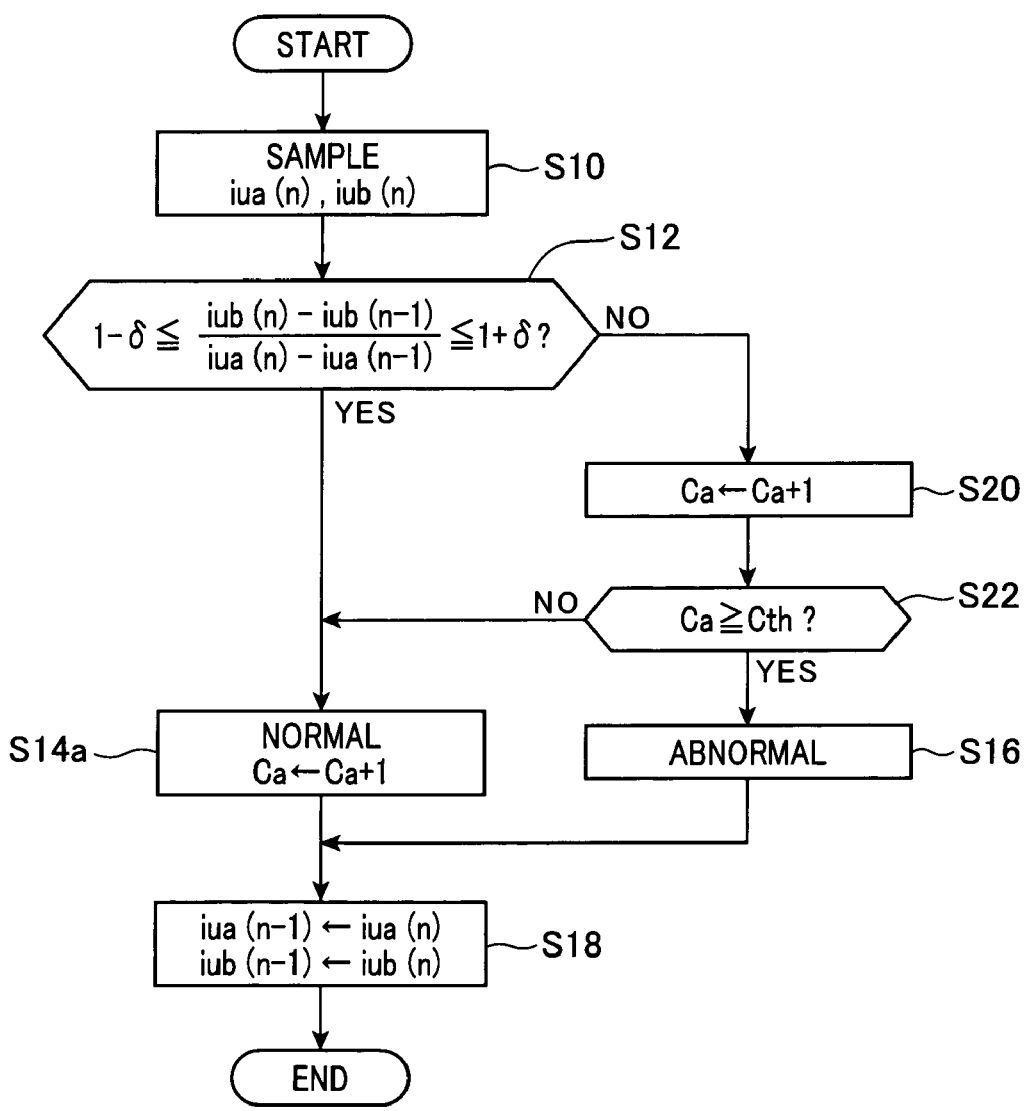
Figure 8:
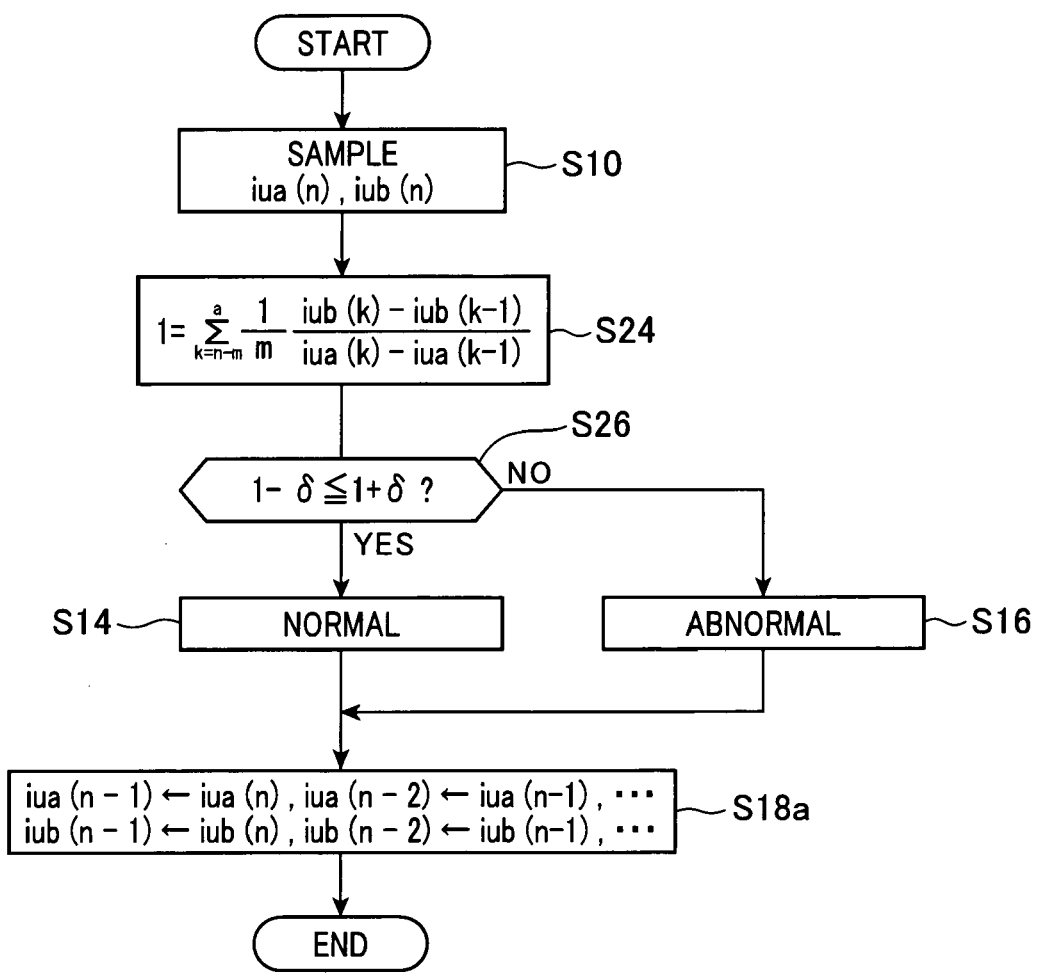
Figure 9:
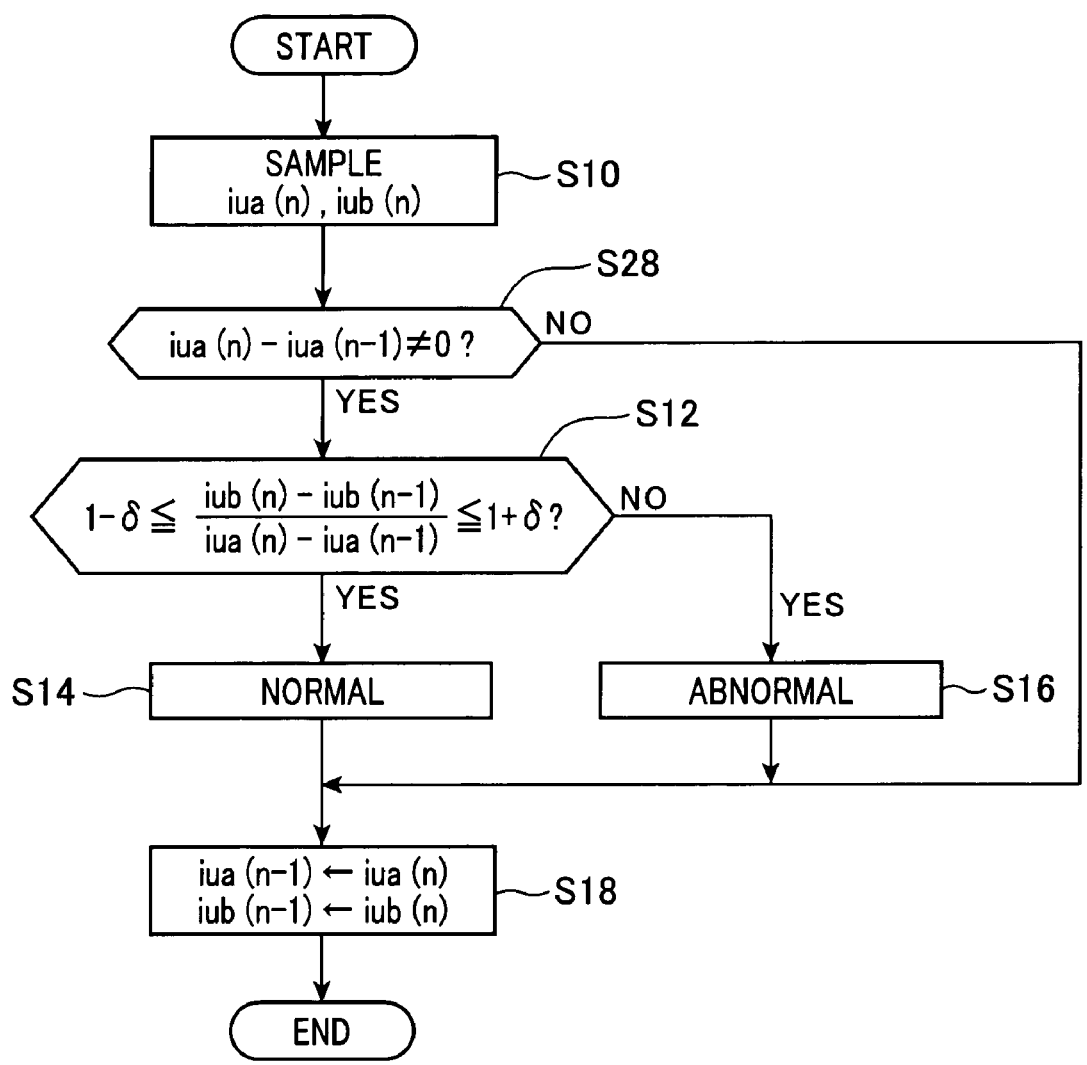
Figure 10:
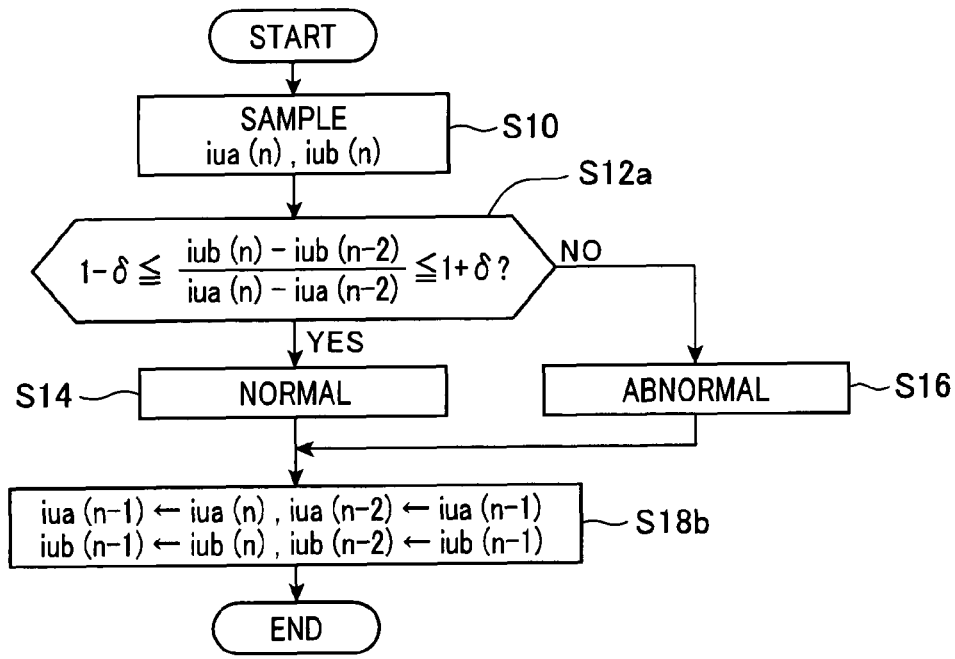
Figure 11:
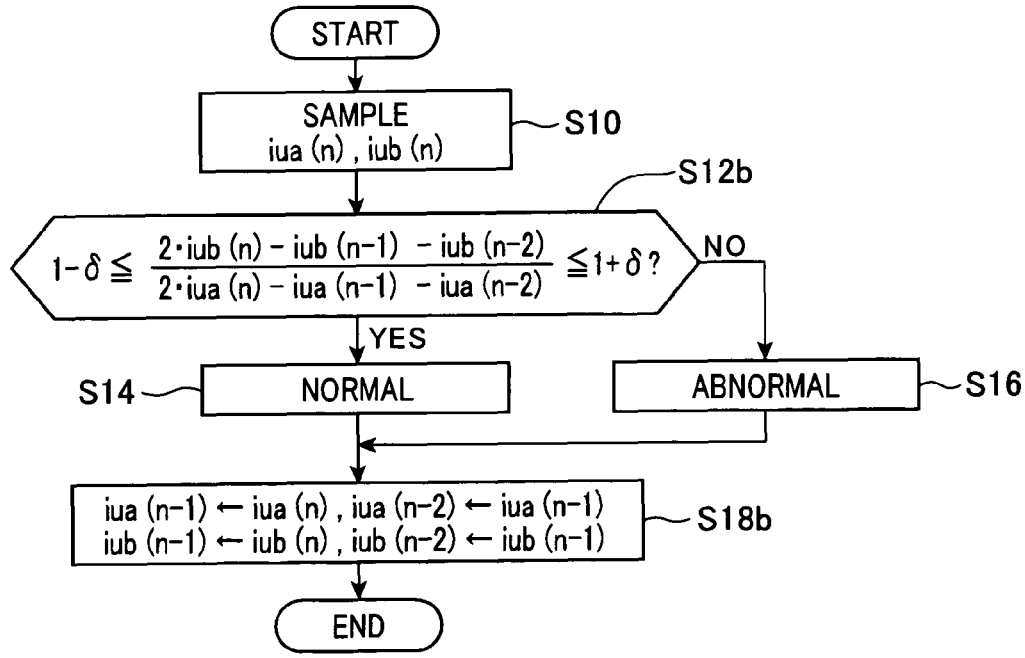
Figure 12:
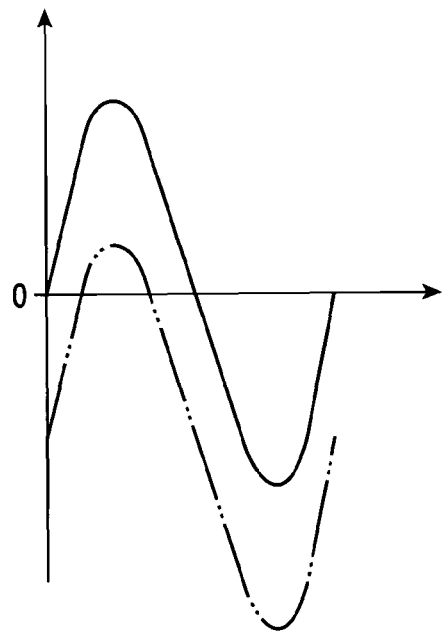
Figure 13:
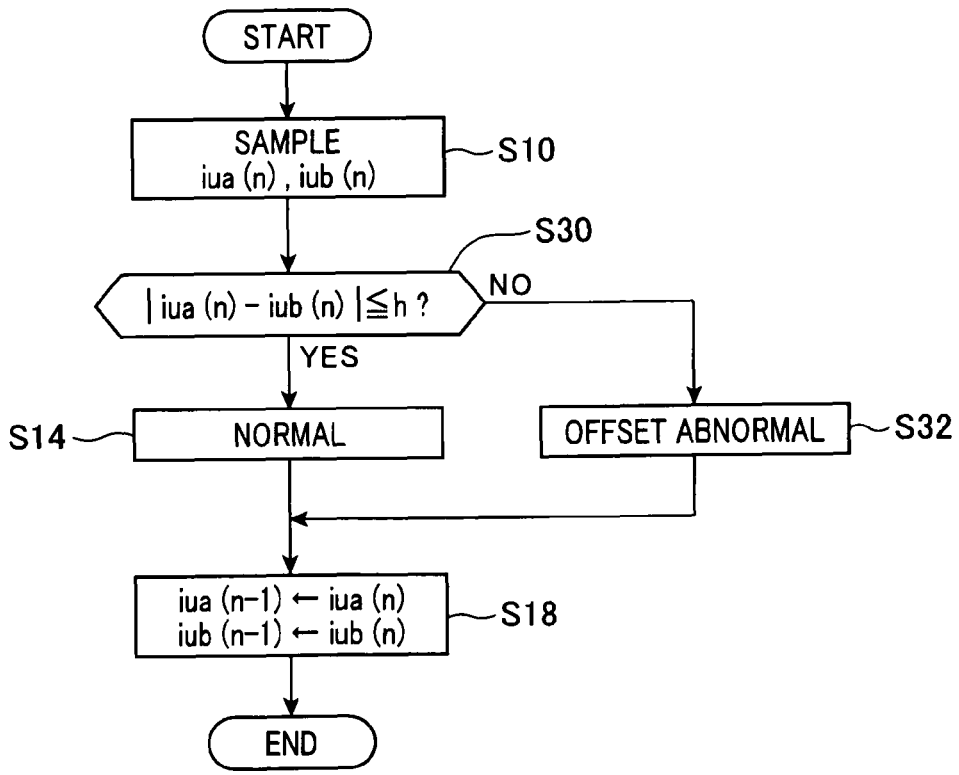
Figure 14:
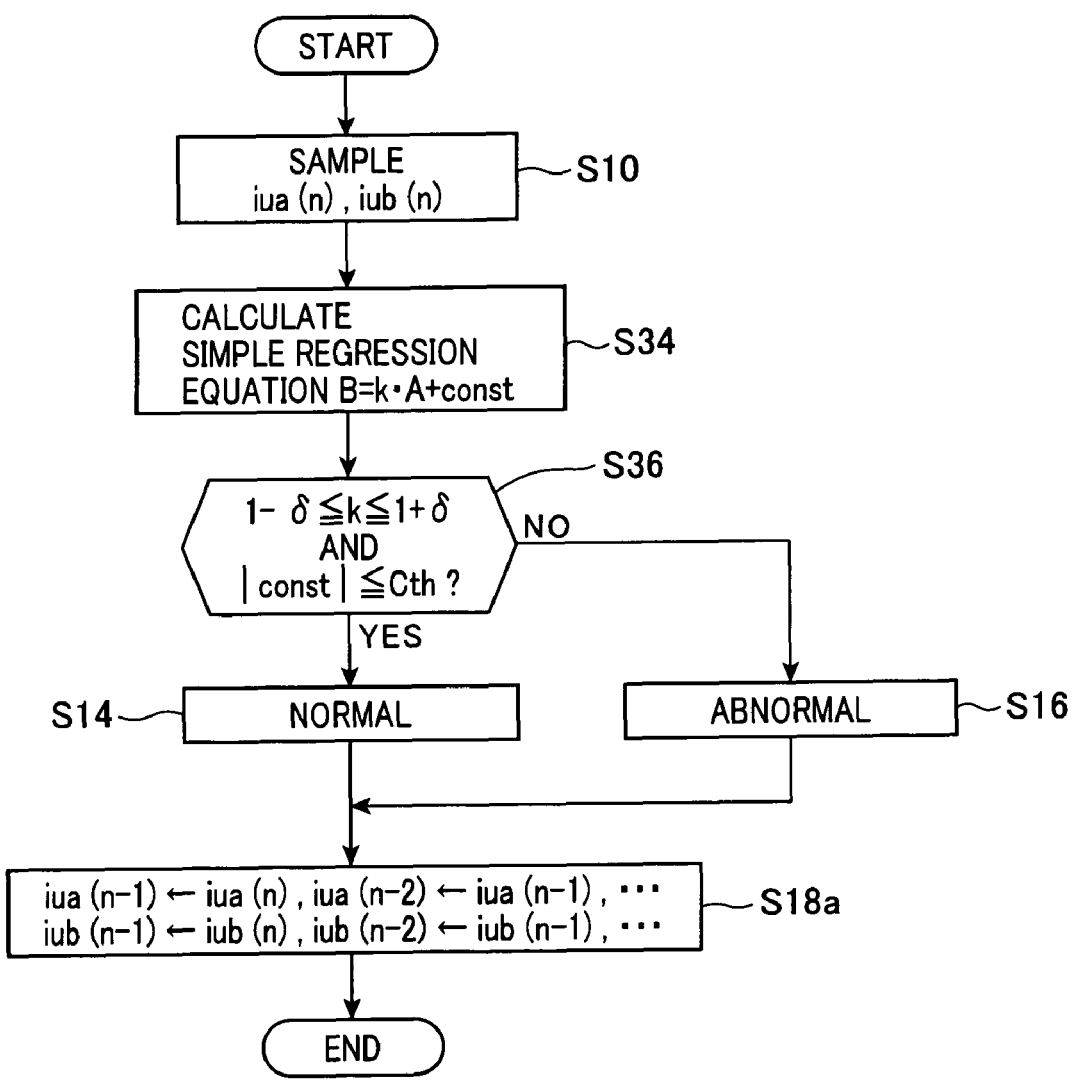
Figure 15:
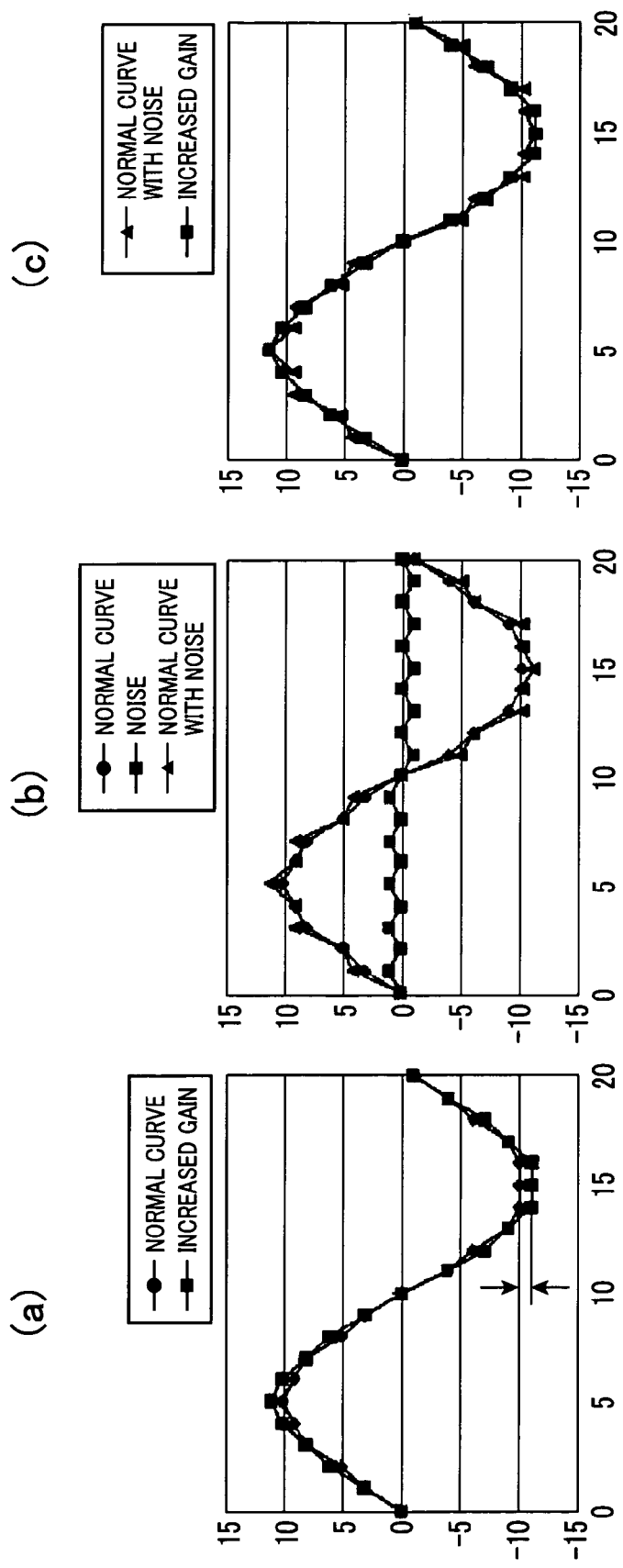
Figure 16:
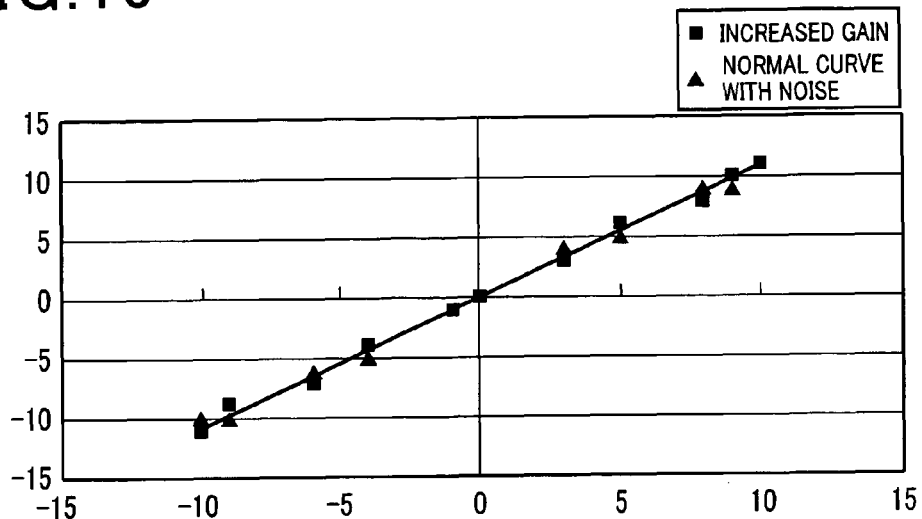
Figure 17:
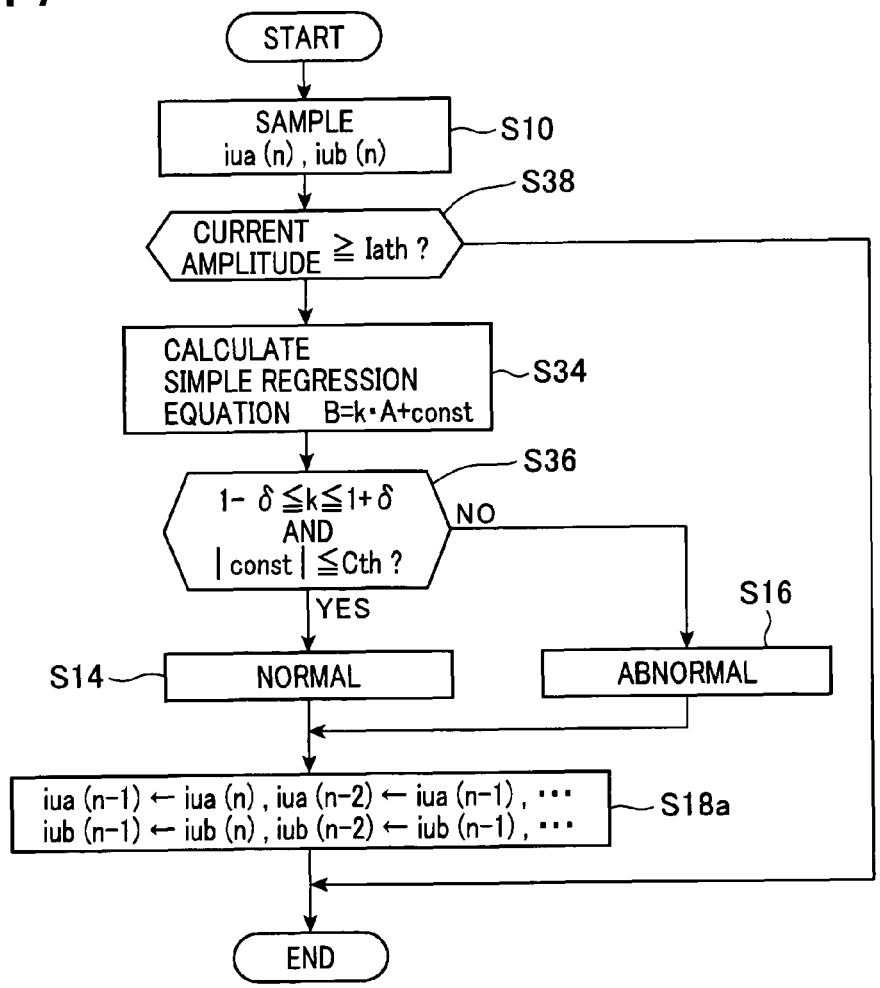
Figure 20:
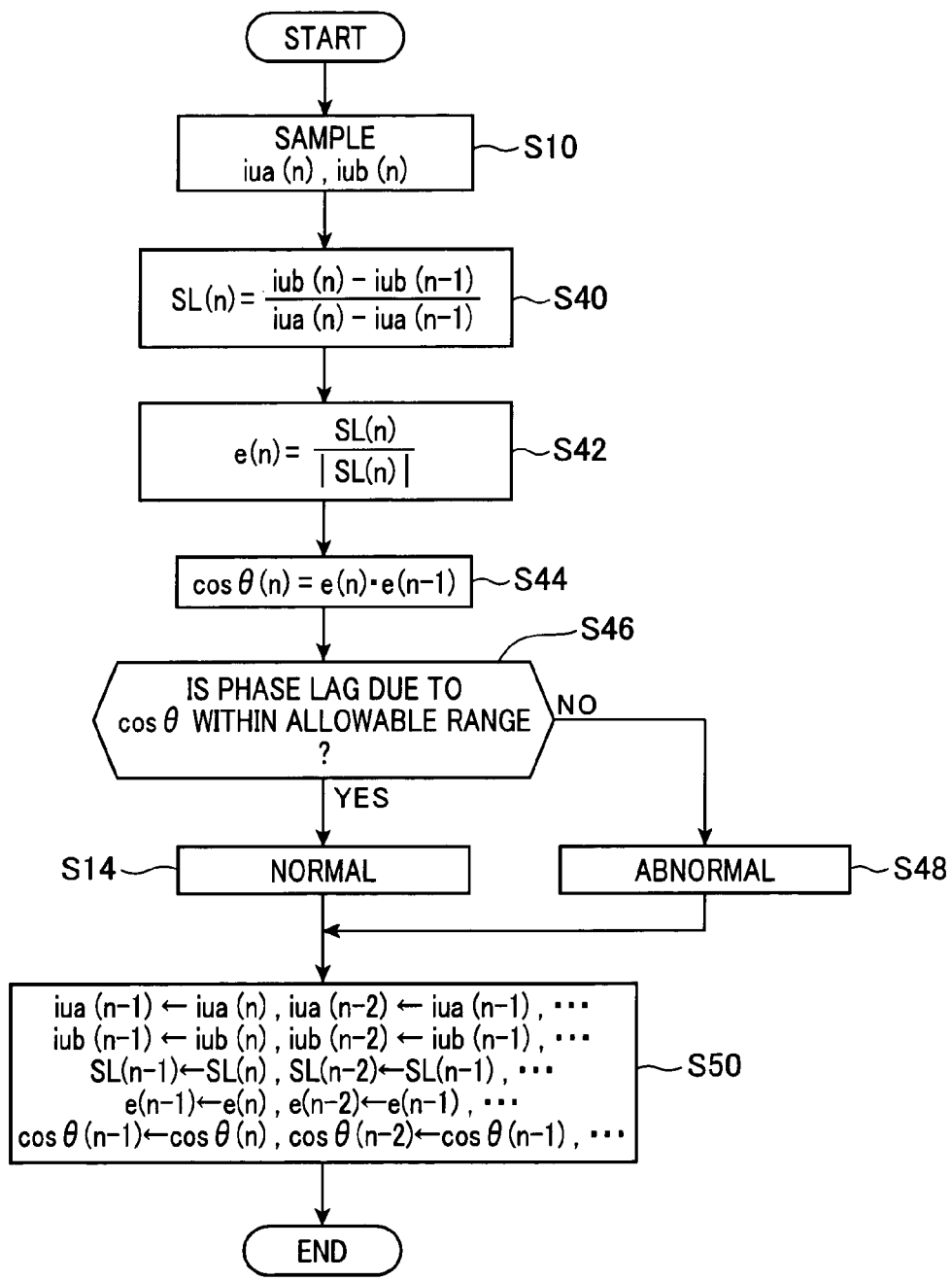
Figure 21:
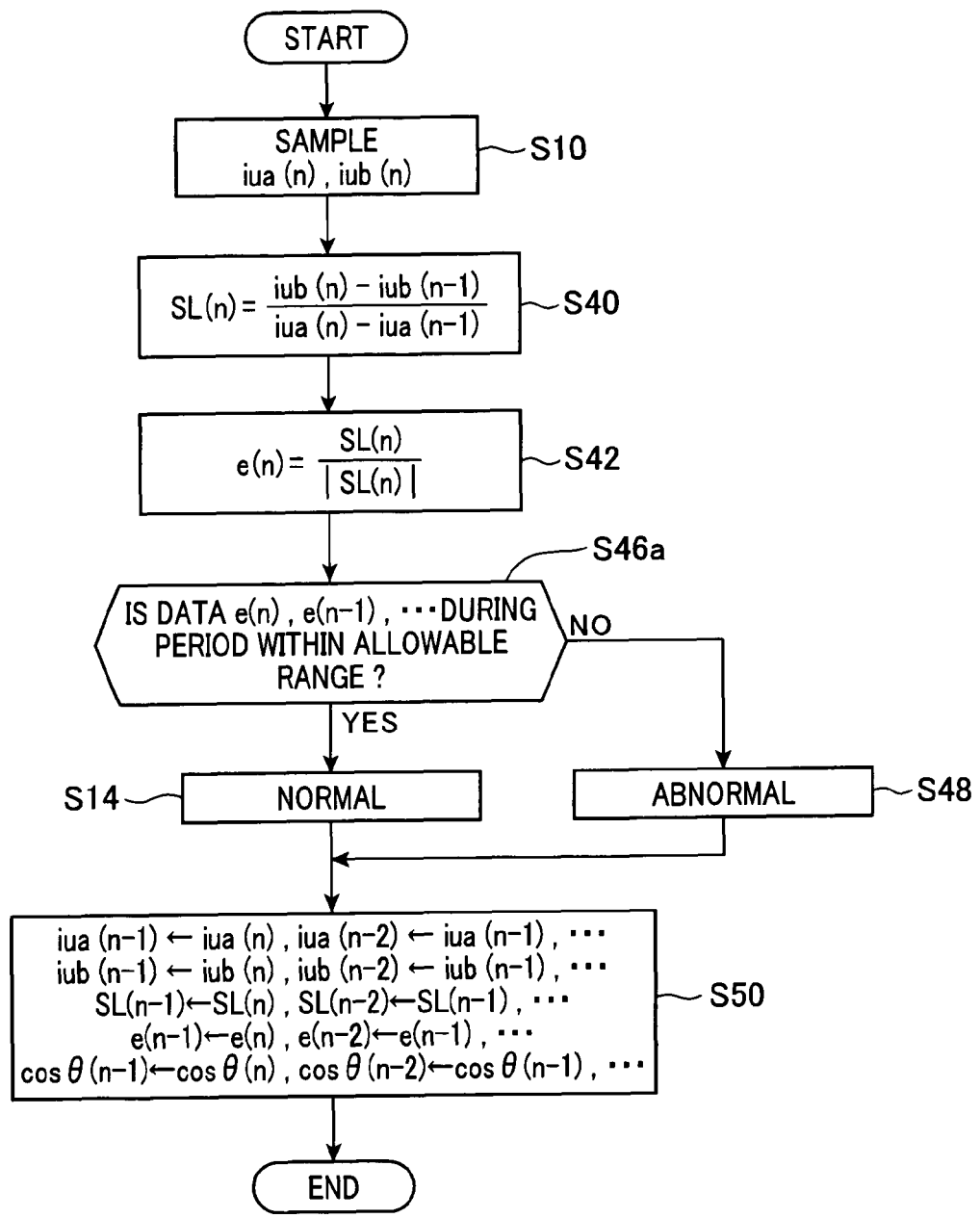
Figure 22:
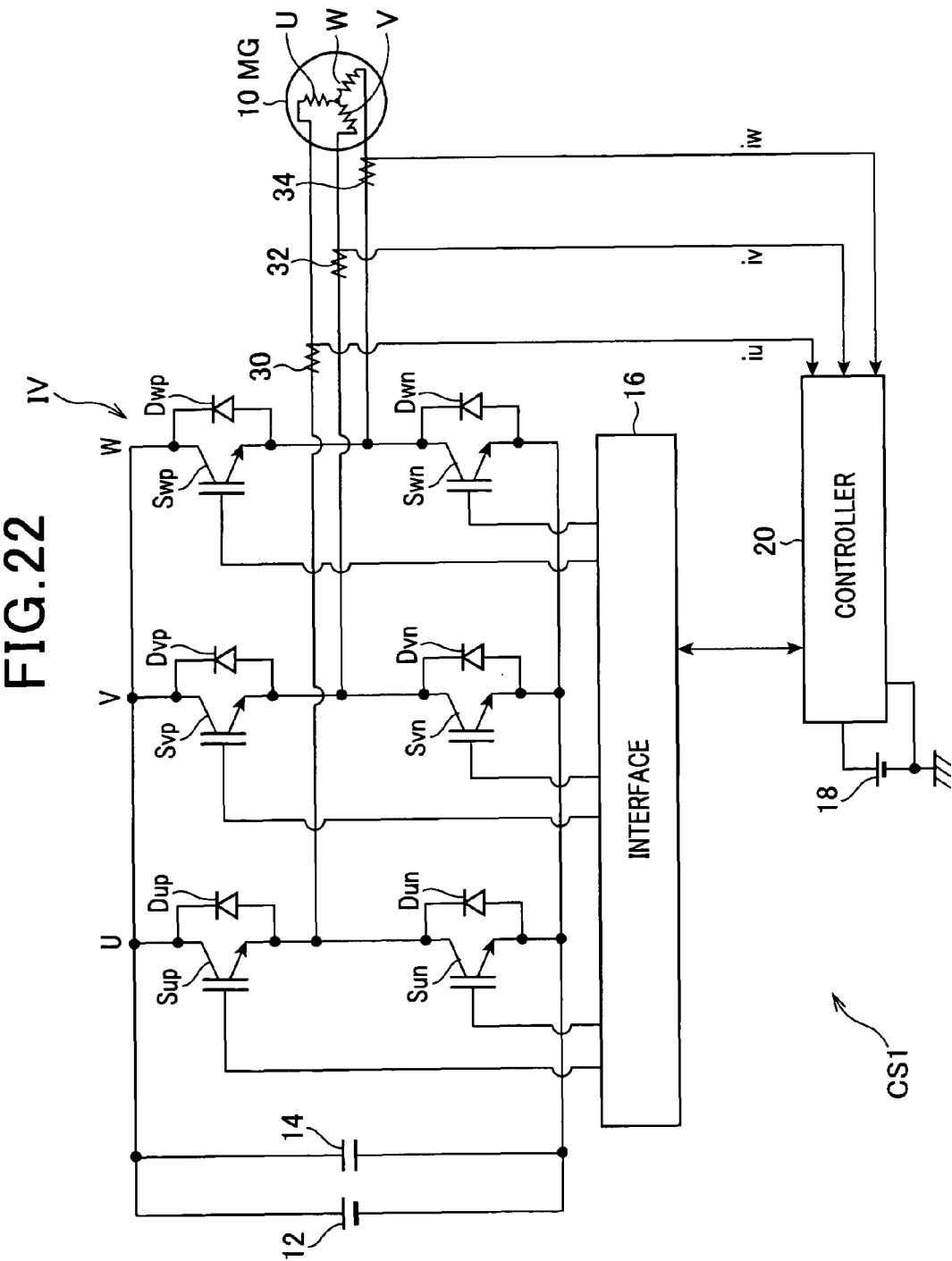
Figure 23:
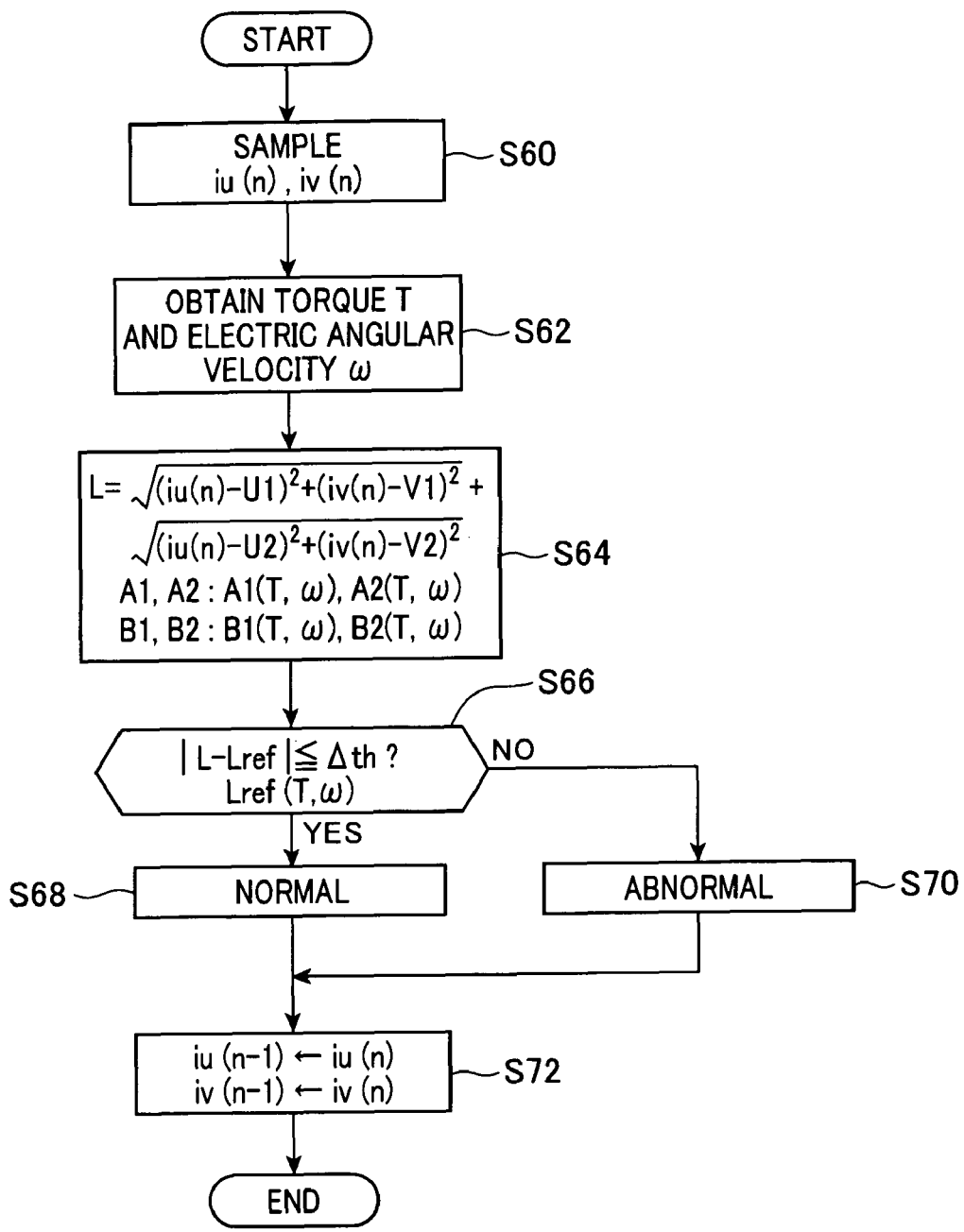
Figure 24:
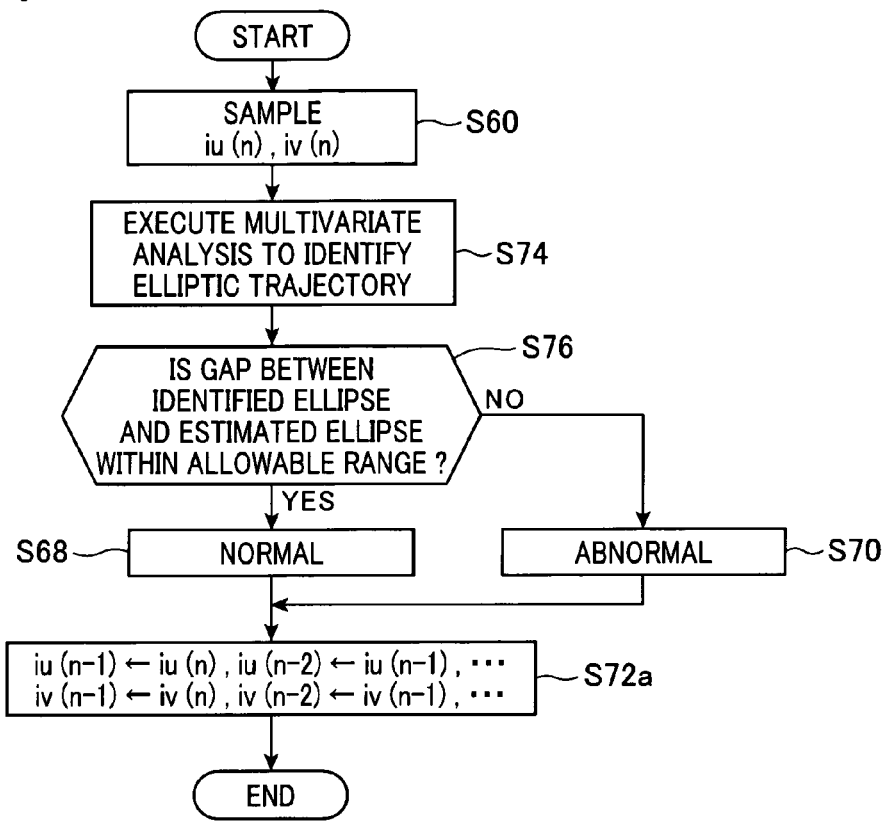
Figure 25:
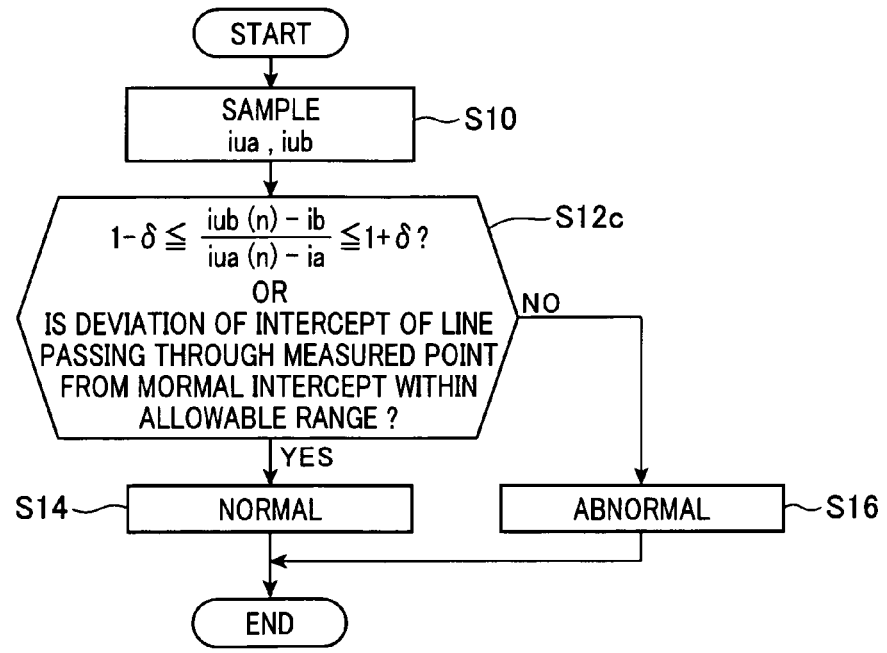

(a) of FIG. 4 is a graph schematically illustrating the transition of measured values sampled from each of a pair of current sensors, one of which is a normal current sensor, the other of which is a current sensor within tolerance according to first embodiment;

(b) of FIG. 4 is a graph schematically illustrating a histogram of the differences between the measured values of the normal current sensor and the corresponding measured values of the current sensor within tolerance according to the first embodiment;

(c) of FIG. 4 is a graph schematically illustrating the transition of measured values sampled from each of a pair of current sensors, one of which is the normal current sensor, the other of which is an abnormal current sensor according to first embodiment;

(d) of FIG. 4 is a graph schematically illustrating a histogram of the differences between the measured values of the normal current sensor and the corresponding measured values of the abnormal current sensor according to the first embodiment;

(a) of FIG. 5 is a graph schematically illustrating gradients SL(n) corresponding to the normal current sensor and the current sensor within tolerance calculated at a plurality of sampling timings according to the first embodiment;

(b) of FIG. 5 is a graph schematically illustrating gradients corresponding to the normal current sensor and the abnormal current sensor calculated at a plurality of the sampling timings according to the first embodiment;

(c) of FIG. 5 is a graph schematically illustrating a histogram of the gradients illustrated in (b) of FIG. 5 and that of the gradients illustrated in (c) of FIG. 5;

(a) of FIG. 6 is a graph schematically illustrating respective output characteristic curves of a normal current sensor, a current sensor within tolerance, and an abnormal sensor, each of which fluctuates in amplitude, according to the first embodiment;

(b) of FIG. 6 is a graph schematically illustrating a histogram of the gradients corresponding to the normal current sensor and the current sensor within tolerance, and a histogram of the gradients corresponding to the normal current sensor and the abnormal current sensor according to the first embodiment;

FIG. 7 is a flowchart schematically illustrating an example of an abnormal diagnosis routine to be executed by the controller according to the second embodiment of the present invention;

FIG. 8 is a flowchart schematically illustrating an example of an abnormal diagnosis routine to be executed by the controller according to the third embodiment of the present invention;

FIG. 9 is a flowchart schematically illustrating an example of an abnormal diagnosis routine to be executed by the controller according to the fourth embodiment of the present invention;

FIG. 10 is a flowchart schematically illustrating an example of an abnormal diagnosis routine to be executed by the controller according to the fifth embodiment of the present invention;

FIG. 11 is a flowchart schematically illustrating an example of an abnormal diagnosis routine to be executed by the controller according to the sixth embodiment of the present invention;

FIG. 12 is a graph schematically illustrating an offset abnormality in at least one of the current sensors according to the seventh embodiment of the present invention;

FIG. 13 is a flowchart schematically illustrating an example of an abnormal diagnosis routine to be executed by the controller according to the seventh embodiment of the present invention;

FIG. 14 is a flowchart schematically illustrating an example of an abnormal diagnosis routine to be executed by the controller according to the eighth embodiment of the present invention;

(a) of FIG. 15 is a graph schematically illustrating, when a corresponding phase current has a low amplitude, a normal output characteristic curve of a normal current sensor, and an output characteristic curve of an abnormal current sensor with an amplitude shift (an increased gain) according to the ninth embodiment of the present invention;

(b) of FIG. 15 is a graph schematically illustrating the normal output characteristic curve of the normal current sensor, a characteristic curve of cyclically oscillating noise, and the normal output characteristic curve of the normal current sensor on which the characteristic curve of cyclically oscillating noise is superimposed when a corresponding phase current has a low amplitude according to the ninth embodiment;

(c) of FIG. 15 is a graph schematically illustrating the normal output characteristic curve of the normal current sensor on which the characteristic curve of cyclically oscillating noise is superimposed, and the output characteristic curve of the abnormal current sensor with the amplitude shift (increased gain) according to the ninth embodiment;

FIG. 16 is a graph schematically illustrating a simple regression line calculated based on a plurality of pairs of measured values sampled from a normal current sensor in noisy environment and that calculated based on a plurality of pairs of measured values sampled from an abnormal current sensor with an increased gain according to the ninth embodiment;

FIG. 17 is a flowchart schematically illustrating an example of an abnormal diagnosis routine to be executed by the controller according to the ninth embodiment of the present invention;

FIG. 18 is a flowchart schematically illustrating an example of an abnormal diagnosis routine to be executed by the controller according to the tenth embodiment of the present invention;

(a) of FIG. 19 is a graph schematically illustrating a phase shift abnormality in at least one of the current sensors according to the eleventh embodiment of the present invention;

(b) of FIG. 19 is a graph schematically illustrating a trajectory of a plurality of pairs of measured values of the current sensors according to the eleventh embodiment of the present invention;

FIG. 20 is a flowchart schematically illustrating an example of an abnormal diagnosis routine to be executed by the controller according to the eleventh embodiment of the present invention;

FIG. 21 is a flowchart schematically illustrating an example of an abnormal diagnosis routine to be executed by the controller according to the twelfth embodiment of the present invention;

FIG. 22 is a circuit and block diagram of a control system for controlling a three-phase motor-generator according to the thirteenth embodiment of the present invention;

FIG. 23 is a flowchart schematically illustrating an example of an abnormal diagnosis routine to be executed by the controller according to the thirteenth embodiment of the present invention;

FIG. 24 is a flowchart schematically illustrating an example of an abnormal diagnosis routine to be executed by the controller according to the fourteenth embodiment of the present invention; and FIG. 25 is a flowchart schematically illustrating an example of an abnormal diagnosis routine to be executed by the controller according to the fifth modification of the present invention.

DETAILED DESCRIPTION OF EMBODIMENTS OF THE INVENTION

Embodiments of the present invention will be described hereinafter with reference to the accompanying drawings. In each of the embodiments, the present invention is, for example, applied to a control system for a three-phase motor-generator, this three-phase motor-generator is an example of various types of rotary machines.

First Embodiment

Figure 1:
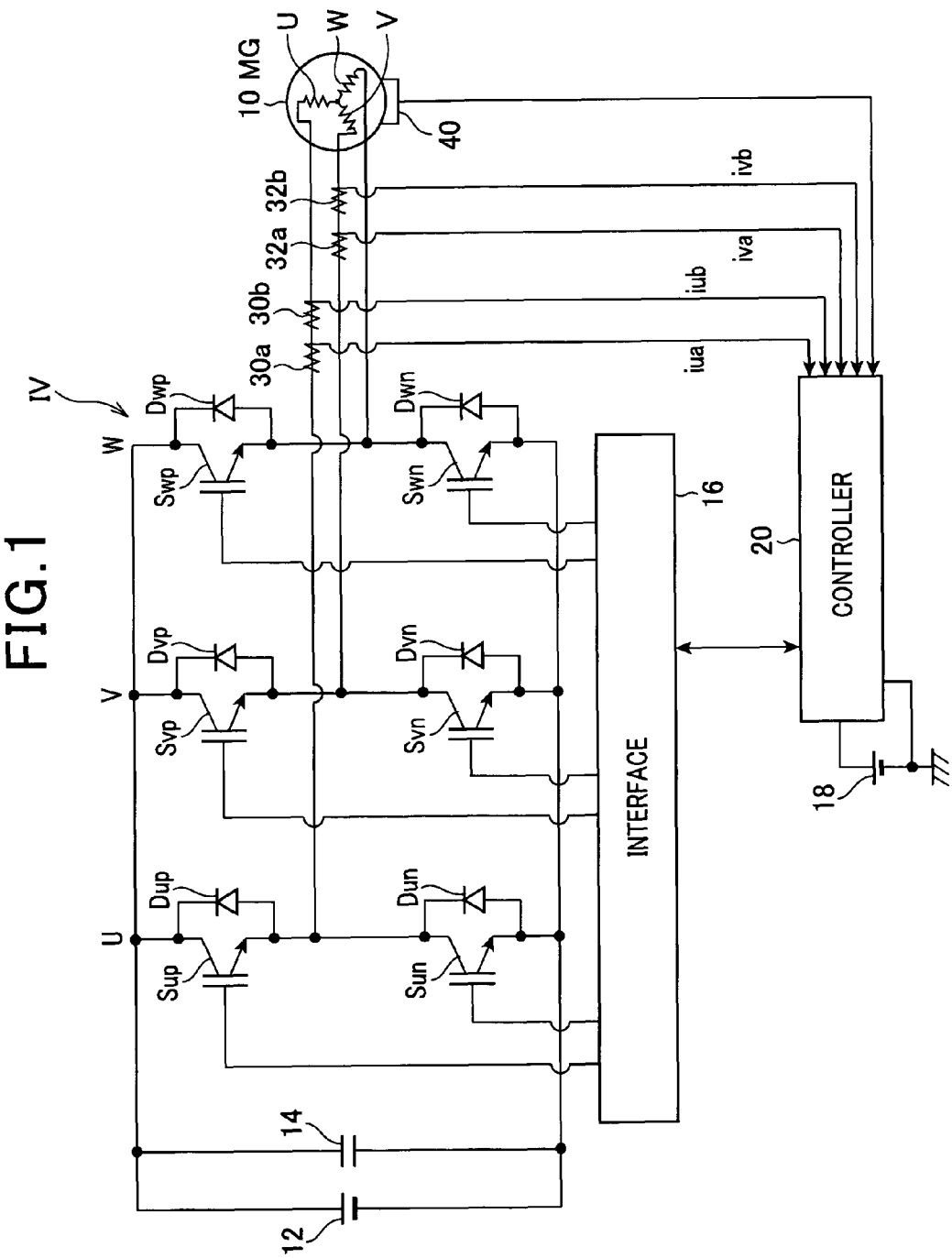
FIG. 1 is a circuit and block diagram of a control system for controlling a three-phase motor-generator according to the first embodiment of the present invention.

Referring to the drawings, particularly to FIG. 1, there is illustrated a three-phase motor-generator, referred to simply as "motor-generator" 10.

In FIG. 1, there is also illustrated an inverter IV serving as a power converter, a high-voltage battery (battery) 12, a capacitor 14, an interface 16, a first pair of current sensors 30a and 30b, a second pair of current sensors 32a and 32b, a rotational angle sensor 40, and a controller 20. The inverter IV, the battery 12, the capacitor 14, the interface 16, the current sensors 30a, 30b, 32a, and 32b, and the rotational angle sensor 40 provide a control system CS for the motor-generator 10.

Specifically, the motor-generator 10 and the battery 12 can establish electrical connection therebetween via the inverter IV.

For example, the motor-generator 10 is comprised of, for example, three-phase armature windings and a field member. When three-phase sinusoidal driving currents as an example of drive currents for the motor-generator 10 are supplied to flow through the three-phase armature windings via the inverter IV, respectively, the three-phase armature windings generate a magnetic field. The generated magnetic field and a magnetic field generated by the field member rotate any one of the armature and the field member relative to the other thereof to thereby rotate the motor-generator 10 (rotate a rotor of the motor-generator 10).

On the other hand, when the field member is rotated, the rotating field member creates magnetic flux. The created magnetic flux induces a three-phase AC voltage in the three-phase armature windings so that the three-phase AC voltage is supplied as a DC voltage to the battery 12 via the inverter IV and the capacitor 14, charging the battery 12.

The inverter IV is designed as a three-phase inverter. The inverter IV is comprised of a first pair of series-connected high- and low-side switching elements Sup and Sun, a second pair of series-connected high- and low-side switching elements Svp and Svn, and a third pair of series-connected high- and low-side switching elements Swp and Swm. The inverter IV is also comprised of flywheel diodes Dup, Dun, Dvp, Dvn, Dwp, and Dwn electrically connected in antiparallel to the switching elements Sup, Sun, Svp, Sun, Swp, and Swn, respectively.

In the first embodiment, as the switching elements Sup, Sun, Svp, Svn, Swp, and Swn, IGBTs are respectively used.

When power MOSFETs are used as the switching elements Sup, Sun, Svp, Svn, Swp, and Swn, intrinsic diodes of the power MOSFETs can be used as the flywheel diodes, thus eliminating the flywheel diodes.

The cathode of each of the flywheel diodes Dup, Dun, Dvp, Dvn, Dwp, and Dwn is connected with the drain of a corresponding one of the switching elements Sup, Sun, Svp, Svn, Swp, and Swn, and the anode thereof is connected with the source of a corresponding one of the switching elements Sup, Sun, Svp, Svn, Swp, and Swn.

The first, second, and third pairs of switching elements Sup, Sun, Svp, Svn, Swp, and Swn are parallely connected with each other in bridge configuration.

Ends of the high-side switching elements (upper arms) Sup, Sup, and Swp are collected as a common connection terminal (DC input terminal), and the common connection terminal is connected with one electrode of the capacitor 14 and the positive electrode of the battery 12. Ends of the low-side switching elements (lower arms) Sun, Svn, and Swn are collected as a common connection terminal (DC input terminal), and the common connection terminal is connected with the negative electrode of the battery 12.

For example, the three-phase armature windings (U-, V-, and W-phase windings U, V, and W) each have one end connected to a common junction (neutral point) and the other end to a separate terminal in, for example, a star-configuration. The three-phase armature windings in the star-configuration have a relative phase shift of 120 degrees. The separate terminal of the U-phase winding U is connected with the connection point between the series-connected switching elements Sup and Sun. The separate terminal of the V-phase winding V is connected with the connection point between the series-connected switching elements Svp and Svn. The separate terminal of the W-phase winding W is connected with the connection point between the series-connected switching elements Swp and Swn.

The controller 20 is designed as, for example, a computer circuit consisting essentially of, for example, a CPU, an I/O interface, and a memory unit, and operates on a low-voltage battery 18 lower than the battery 12 as its power source. Thus, the controller 20 constitutes a low voltage system.

The controller 20 is designed to drive via the interface 16 the inverter IV to supply three-phase sinusoidal drive currents to the three-phase armature windings (U-, V-, and W-phase windings U, V, and W) based on a voltage (DC voltage) of the battery 12, thus rotating the rotor of the motor-generator 10.

The controller 20 is also designed to adjust controlled variables of the motor-generator 10 as controlled targets thereof to desired values. The interface 16 is provided with insulators, such as, for example, photo-couplers. The interface 16 is configured to establish electrical insulation between the low voltage system (the controller 20) and the high voltage system (the battery 12 and the inverter IV), and to allow communications therebetween.

In adjusting the controlled variables, the controller 20 references values measured by the current sensors 30a, 30b, 32a, and 32b and the angular sensor 40 as state quantities of the motor-generator 10. These sensors 30a, 30b, 32a, 32b, and 40 are communicably connected with the controller 20.

Specifically, each of the current sensors 30a and 30b is operative to measure values of a U-phase current flowing through the U-phase winding U and to output the measured values to the controller 20. Similarly, each of the current sensors 32a and 32b is operative to measure values of a V-phase current flowing through the V-phase winding V and to output the measured values to the controller 20. The angular sensor 40 is arranged, for example, close to the motor-generator 10 and operative to measure rotational angles (electric angles) of the rotor. The angular sensor 40 is also operative to output, to the controller 20, measured rotational angles of the rotor (motor-generator 10).

The controller 20 is also designed to diagnose the current sensors 30a, 30b, 32a, and 32b to determine whether there is an abnormality in at least one of the current sensors 30a and 30b and in at least one of the current sensors 32a and 32b.

Specifically, the controller 20 according to the first embodiment is designed to compare information indicative of the trajectory (change) of a plurality of sequential pairs of measured values of the paired current sensors 30a and 30b with corresponding reference information of a reference trajectory. The trajectory is a function defining the relationship between at least one pair of the plurality of sequential pairs of measured values of the paired current sensors 30a and 30b. The trajectory can be plotted in a two-dimensional coordinate system whose horizontal and vertical axes respectively represent the measured values of the current sensor 30a and the measured values of the current sensor 30b.

Similarly, the controller 20 according to the first embodiment is designed to compare information indicative of the trajectory (change) of a plurality of sequential pairs of measured values of the paired current sensors 32a and 32b with corresponding reference information of a reference trajectory. The trajectory is a function defining the relationship between at least one pair of the plurality of sequential pairs of measured values of the paired current sensors 32a and 32b. The trajectory can be plotted in a two-dimensional coordinate system whose horizontal and vertical axes respectively represent the measured values of the current sensor 32a and the measured values of the current sensor 32b.

Figure 2:
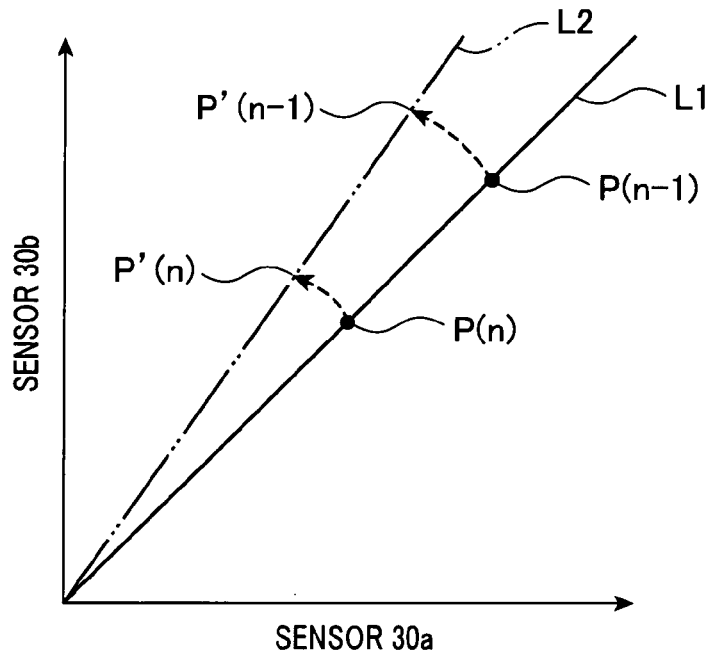
FIG. 2 is a graph schematically illustrating a solid line passing through two pairs of measured values of respective current sensors, which are normal, for a same U-phase current, and a chain double-dashed line mismatched with the solid line due to an abnormality in at least one of the current sensors.

FIG. 2 illustrates a graph whose horizontal axis represents the measured values of the current sensor 30a and whose vertical axis represents the measured values of the current sensor 30b. In the graph, one pair (point) of measured values iua(n) and iub(n) of the respective current sensors 30a and 30b at a same time is represented by P(n), and an alternative pair (point) of measured values iua(n−1) and iub(n−1) of the respective current sensors 30a and 30b at an alternative same time is represented by P(n−1). Specifically, a line passing through the one pair P(n) of measured values iua(n) and iub(n) and the alternative pair P(n−1) of measured values iua(n−1) and iub(n−1) represents the trajectory of the pairs P(n) and P(n−1) of the measured values of the respective current sensors 30a and 30b.

If there are no abnormalities in each current sensor 30a, 30b, the line passing through the one pair P(n) of measured values iua(n) and iub(n) and the alternative pair P(n−1) of measured values iua(n−1) and iub(n−1) is represented as a reference line (solid line L1) corresponding to the reference trajectory (see FIG. 2). In other words, if there are no abnormalities in each of the current sensors 30a and 30b, the line passing through the one pair P(n) of measured values iua(n) and iub(n) and the alternative pair P(n−1) of measured values iua(n−1) and iub(n−1) is matched with the reference line L1.

However, if there is an abnormality in at least one of the current sensors 30a and 30b, a line passing through one pair P′(n) of measured values iua′(n) and iub′(n) at the same time (n) and an alternative pair P′(n−1) of measured values iua′(n−1) and iub′(n−1) is represented as a chain double-dashed line L2. The chain double-dashed line L2 is mismatched with the reference line L1.

Figure 3:
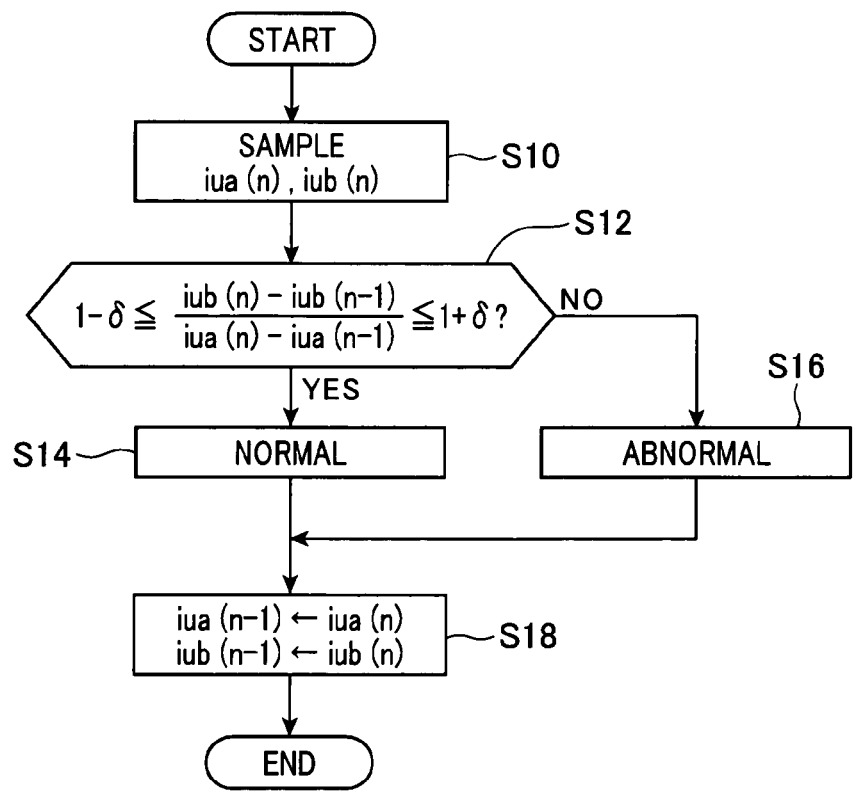
FIG. 3 is a flowchart schematically illustrating an example of an abnormal diagnosis routine to be executed by a controller illustrated in FIG. 1 according to the first embodiment.

An abnormal diagnosis routine to be executed by the controller 20 will be described hereinafter with reference to FIG. 3. The controller 20 repeatedly executes the abnormal diagnosis routine in a preset cycle, such as in a cycle of a preset electric angle. Note that the abnormal diagnosis routine illustrated in FIG. 3 is a routine for diagnosing whether there is an abnormality in each of the current sensors 30a and 30b for the U-phase current. Because the abnormal diagnosis routine for diagnosing whether there is an abnormality in each of the current sensors 32a and 32b is identical to the abnormal diagnosis routine illustrated in FIG. 3, it is omitted in description.

When launching the abnormal diagnosis routine at a present cycle (n), the controller 20 samples a measured value iua(n) and a measured value iub(n) from the respective current sensors 30a and 30b at the present cycle (n) in step S10.

Next, the controller 20 calculates a gradient SL(n) of a line in step S12; this line passes through: the measured values iua(n) and iub(n) sampled from the respective current sensors 30a and 30b at the present cycle (n), and the measured values iua(n−1) and iub(n−1) sampled from the respective current sensors 30a and 30b at the previous cycle (n−1). These measured values iua(n−1) and iub(n−1) have been stored in step S18 in the previous cycle described later.

Specifically, in step S12, the controller 20 calculates the gradient SL(n) of the line in the following equation:

$$SL(n) = \frac{iub(n) - iub(n-1)}{iua(n) - iua(n-1)}$$

That is, the gradient SL(n) represents a ratio of change in the measured values of the current sensor 30b to change in the measured values of the current sensor 30a.

Note that if the present cycle (n) is 1, that is, the controller 20 is executing the abnormal diagnosis routine at the first time the controller 20 uses zero as each of the measured values iua(n−1) and iub(n−1).

Then, in step S12, the controller 20 determines whether the calculated gradient SL(n) is equal to or greater than 1−δ or is equal to or smaller than 1+δ; δ is a threshold value. If there are no abnormalities in each of the paired current sensors 30a and 30b so that the current sensors 30a and 30b have normal output characteristics identical to each other (YES in step S12), a measured value of the current sensor 30a and that of the current sensor 30b sampled at a same time therefrom are identical to each other. Thus, the gradient SL(n) becomes "1". For this reason, if the deviation of the gradient SL(n) from "1" is equal to or smaller than the threshold value δ (YES in step S12), the controller 20 diagnoses that there are no abnormalities in each of the current sensors 30a and 30b in step S14. In other words, the controller 20 determines that each of the current sensors 30a and 30b is a normal current sensor in step S14.

Otherwise, if the deviation of the gradient SL(n) from "1" is greater than the threshold value δ (NO in step S12), the controller 20 diagnoses that there is an abnormality in at least one of the current sensors 30a and 30b in step S16.

After completion of the operation in step S14 or S16, the controller 20 regards the measured values iua(n) and iub(n) sampled at the present cycle (n) as the measured values iua(n−1) and iub(n−1) sampled at the previous cycle (n−1) in step S18. In other words, the controller 20 decrements the sampling number "n" by 1 in step S18. The controller 20 also stores therein the measured values iua(n−1) and iub(n−1) in step S18, exiting the abnormal diagnosis routine.

As described above, the controller 20 according to the first embodiment is configured to diagnose whether there is an abnormality in at least one of the current sensors 30a and 30b (32a and 32b) using the gradient SL(n) of the line (trajectory) passing through a plurality of sequential pairs of measured values of the current sensors 30a and 30b. Thus, it is possible to maintain the accuracy of the abnormal diagnosis at a high level while increasing the frequency of execution of the abnormal diagnosis for the following reasons.

(a) of FIG. 4 schematically illustrates the transition of the measured values sampled from each of the paired current sensors 30a and 30b.

Specifically, because a U-phase sinusoidal drive current is supplied from the inverter IV to the U-phase winding U, the output characteristic curve of each of the paired current sensors 30a and 30b is a sinusoidal wave illustrated in (a) of FIG. 4. The normal output characteristic curve to be employed for each of the current sensors 30a and 30b according to the first embodiment is defined as a normal median characteristic curve within upper and lower tolerance limit curves. A solid sinusoidal wave illustrated in (a) of FIG. 4 represents the normal output characteristic curve (normal medial characteristic curve) to be employed for each of the current sensors 30a and 30b.

In the first embodiment, one of the paired current sensors 30a and 30b has the normal output characteristic curve. Hereinafter, one of the paired current sensors 30a and 30b having the normal output characteristic curve will be referred to as a "normal current sensor". In contrast, the other of the paired current sensors 30a and 30b has an output characteristic curve with an amplitude shift within the upper and lower tolerance limit curves; this output characteristic curve is illustrated by a chain line in (a) of FIG. 4. Hereinafter, the other of the paired current sensors 30a and 30b having the output characteristic curve with the amplitude shift within the upper and lower tolerance limit curves will be referred to as a "current sensor within tolerance".

Note that a dashed sinusoidal wave with a low amplitude illustrated in (a) of FIG. 4 represents the difference between the output characteristic curve of the normal current sensor and the output characteristic curve of the current sensor within tolerance. In other words, the dashed sinusoidal waveform illustrated in (a) of FIG. 4 represents the differences between the measured values of the normal current sensor and the corresponding measured values of the current sensor within tolerance. As illustrated in (a) of FIG. 4, the difference cyclically oscillates over time. (b) of FIG. 4 schematically illustrates the histogram of the differences between the measured values of the normal current sensor and the corresponding measured values of the current sensor within tolerance, (c) of FIG. 4 represents the normal output characteristic curve (normal medial characteristic curve) of the normal current sensor set forth above, and an output characteristic curve with an amplitude shift out of the upper and lower tolerance limit curves; this curve is illustrated by a chain double-dashed line in (c) of FIG. 4. Hereinafter, the other of the paired current sensors 30a and 30b having the output characteristic curve with the amplitude shift out of the upper and lower tolerance limit curves will be referred to as an "abnormal current sensor".

A dashed sinusoidal wave illustrated in (c) of FIG. 4 represents the difference between the output characteristic curve of the normal current sensor and the output characteristic curve of the abnormal current sensor. In other words, the dashed sinusoidal waveform illustrated in (c) of FIG. 4 represents the differences between the measured values of the normal current sensor and the corresponding measured values of the abnormal current sensor. As illustrated in (c) of FIG. 4, the difference cyclically oscillates over time, (d) of FIG. 4 schematically illustrates the histogram of the differences between the measured values of the normal current sensor and the corresponding measured values of the abnormal current sensor.

Comparison between the histogram illustrated in (b) of FIG. 4 and that illustrated in (d) of FIG. 4 demonstrates the following matter.

Specifically, the values of the differences between the measured values of the normal current sensor and the corresponding measured values of the current sensor within tolerance are matched with some of the values of the differences between the measured values of the normal current sensor and the corresponding measured values of the abnormal current sensor. In other words, some of the values of the differences between the measured values of the normal current sensor and the corresponding measured values of the abnormal current sensor cannot be distinguished from the values of the differences between the measured values of the normal current sensor and the corresponding measured values of the current sensor within tolerance.

Thus, if the controller 20 were configured to diagnose the paired current sensors 30a and 30b based on comparison of a threshold value with the values of the differences between their measured values, the diagnosis could be carried out only if the absolute value of the difference between a corresponding measured value of the current sensor 30a and that of the current sensor 30b is relatively high. For this reason, this configuration would reduce the frequency of execution of the abnormal diagnosis for the paired current sensors 30a and 30b.

In addition, this configuration would require a task to watch whether the absolute value of the difference between a corresponding measured value of the current sensor 30a and that of the current sensor 30b is relatively high, resulting in an increased load on the controller 20.

In contrast, the controller 20 according to the first embodiment is configured to diagnose the paired current sensors 30a and 30b based on the gradient SL(n) of each line passing through a corresponding set of temporally adjacent one pair P(n) of measured values and alternative pair P(n−1) of measured values of the current sensors 30a and 30b.

(a) of FIG. 5 represents the gradients SL(n) corresponding to the normal current sensor and the current sensor within tolerance calculated at a plurality of the sampling timings n. (b) of FIG. 5 represents the gradients SL(n) corresponding to the normal current sensor and the abnormal current sensor calculated at a plurality of the sampling timings n.

As illustrated in (a) and (b) of FIG. 5, the gradients SL(n) are substantially constant independently of any sampling timing of measured values from the normal current sensor and the current sensor within tolerance (or the abnormal current sensor). The histogram of the gradients SL(n) illustrated in (c) of FIG. 5 demonstrates that any one of the gradients SL(n) calculated at a corresponding sampling timing between the normal current sensor and the current sensor within tolerance can be easily distinguished from the gradients SL(n) calculated at a plurality of sampling timings (n) between the normal current sensor and the abnormal current sensor.

Thus, the controller 20 according to the first embodiment can diagnose whether there is an abnormality in at least one of the paired current sensors 30a and 30b based on a pair of measured values sampled from the current sensors 30a and 30a at a given timing. This can sufficiently ensure the frequency of execution of the abnormal diagnosis for the paired current sensors 30a and 30b.

If the U-phase sinusoidal drive current to be supplied from the inverter IV to the U-phase winding U fluctuates in amplitude, the normal output characteristic curve of the normal current sensor fluctuates in amplitude too (see a solid line in (a) of FIG. 6). Similarly, the output characteristic curve with an amplitude shift within the upper and lower tolerance limit curves of the current sensor within tolerance fluctuates in amplitude (see a chain line in (a) of FIG. 6. In addition, the output characteristic curve with an amplitude shift out of the upper and lower tolerance limit curves fluctuates in amplitude (see a chain double-dashed line in (a) of FIG. 6).

In this amplitude-fluctuation case, as illustrated by a chain line in (b) of FIG. 6, the gradients SL(n) corresponding to the normal current sensor and the current sensor within tolerance calculated at a plurality of the sampling timings n are substantially constant independently of any sampling timing of measured values from the normal current sensor and the current sensor within tolerance. Similarly, as illustrated by a chain double-dashed line in (b) of FIG. 6, the gradients SL(n) corresponding to the normal current sensor and the abnormal current sensor calculated at a plurality of the sampling timings n are substantially constant independently of any sampling timing of measured values from the normal current sensor and the abnormal current sensor.

(b) of FIG. 6 clearly demonstrates that the gradients SL(n) corresponding to the normal current sensor and the current sensor within tolerance can be easily distinguished from those corresponding to the normal current sensor and the abnormal current sensor.

In contrast, the maximum value of the differences between the measured values of the normal current sensor and those of either the current sensor within tolerance or the abnormal sensor increases with increase in the amplitude of the U-phase sinusoidal drive current to be supplied from the inverter TV to the U-phase winding U. Thus, it would be more difficult to diagnose the paired current sensors 30a and 30b based on comparison of a threshold value with the values of the differences between their measured values.

Note that the threshold value δ according to the first embodiment is determined such that current sensors each within tolerance can be distinguished from abnormal current sensors. Preferably, the threshold value δ can be determined in consideration with a gap between each of the sampling timings (timings of measurement) of values by the current sensor 30a and a corresponding one of the sampling timings (timings of measurement) of values by the current sensor 30b. The gap is for example an error due to the simultaneity between each of the sampling timings (timings of measurement) of values by the current sensor 30a and a corresponding one of the sampling timings (timings of measurement) of values by the current sensor 30b. The gap is for another example a time lag between the time required for the current sensor 30a to transmit a measured value to the controller 20 and that required for the current sensor 30b to transmit a corresponding measured value to the controller 20.

As described above, the control system CS according to the first embodiment is configured to compare, with a reference gradient at a given diagnosis timing, the gradient of the trajectory passing through at least a first pair of measured values of the current sensors 30a and 30b (32a and 32b) and a second pair of measured values thereof for one-phase winding. Based on a result of the comparison, the control system CS is configured to diagnose whether there is an abnormality in at least one of the current sensors 30a and 30b (32a and 32b). Because the gradient is constant independently of any diagnosis timing, this configuration can achieve the first technical effect of diagnosing whether there in an abnormality in at least one of the current sensors 30a and 30b (32a and 32b) at appropriate timings.

The control system CS according to the first embodiment is configured to use at least the first pair of measured values of the current sensors 30a and 30b (32a and 32b) and the second pair of measured values thereof in calculating the gradient of the trajectory. This configuration can achieve the second technical effect of improving the diagnostic accuracy of the current sensors 30a and 30b (32a and 32b) as compared with using one pair of measured values of the current sensors 30a and 30b (32a and 32b).

The control system CS according to the first embodiment is configured to calculate the gradient of the trajectory passing through the temporally adjacent first pair of measured values of the current sensors 30a and 30b (32a and 32b) and second pair of measured values thereof.

In other words, the controller 20 can calculate the gradient of the trajectory by only storing therein (in the memory unit) the temporally adjacent first pair (present pair) of measured values of the current sensors 30a and 30b (32a and 32b) and second pair (previous pair) of measured values thereof. Thus, it is possible for the controller 20 to reduce the amount of data to be stored therein for diagnosing the current sensors 30a and 30b (32a and 32b), thus sufficiently ensuring the available storage capacity therein.

Second Embodiment

A control system according to the second embodiment of the present invention will be described hereinafter with reference to FIG. 7.

The structure of the control system according to the second embodiment is substantially identical to that of the control system CS according to the first embodiment except for the following different points. So, like parts between the control systems according to the first and second embodiments, to which like reference characters are assigned, are omitted or simplified in description.

An abnormal diagnosis routine to be executed by the controller 20 according to the second embodiment will be described hereinafter with reference to FIG. 7 in place of FIG. 3. In FIG. 7, like operations between the routines in FIGS. 3 and 7, to which like numbered steps are assigned, are omitted in description. The controller 20 repeatedly executes the abnormal diagnosis routine in a preset cycle, such as in a cycle of a preset electric angle.

Note that the abnormal diagnosis routine illustrated in FIG. 7 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 7, it is omitted in description.

When launching the abnormal diagnosis routine at a present cycle (n), the controller 20 carries out the sampling operation in step S10 set forth above.

Next, the controller 20 determines whether the calculated gradient SL(n) is equal to or greater than 1−δ or is equal to or smaller than 1+δ in step S12 set forth above.

If the deviation of the gradient SL(n) from "1" is greater than the threshold value δ (NO in step S12), the controller 20 proceeds to step S20. In step S20, the controller 20 increments a count value of an abnormality counter Ca by 1. The abnormality counter Ca is preinstalled in the controller 20 by software or hardware. An initial value of the count value of the abnormality counter Ca is set to zero.

Following the operation in step S20, the controller 20 determines whether the count value of the abnormality counter Ca is equal to or higher than a preset threshold number Cth in step S22. The preset threshold number Cth is set to be higher than 1. The operation in step S22 is to determine whether there is an abnormality in at least one of the current sensors 30a and 30b.

Specifically, the controller 20 according to the second embodiment is configured to, if the number of determinations, each representing that the deviation of the gradient SL(n) from "1" is greater than the threshold value δ, is lower than the threshold number Cth (NO in step S22), diagnose that there are no abnormalities in each of the current sensors 30a and 30b in step S14a. In other words, the controller 20 determines that each of the current sensors 30a and 30b is a normal current sensor in step S14a. In step S14a, the controller 20 resets the count value of the abnormality counter Ca to zero.

Otherwise, if the number of determinations, each representing that the deviation of the gradient SL(n) from "1" is greater than the threshold value δ, is equal to or higher than the threshold number Cth (YES in step S22), the controller 20 diagnoses that there is an abnormality in at least one of the current sensors 30a and 30b in step S16.

As described above, the control system according to the second embodiment is configured to, even if noise or the like enters in the output of at least one of the current sensors 30a and 30b so that determinations, each representing that the deviation of the gradient SL(n) from "1" is erroneously greater than the threshold value δ, are repeated at a number of times lower than the threshold number Cth, prevent the determination that there is an abnormality in at least one of the current sensors 30a and 30b.

Third Embodiment

A control system according to the third embodiment of the present invention will be described hereinafter with reference to FIG. 8.

The structure of the control system according to the third embodiment is substantially identical to that of the control system CS according to the first embodiment except for the following different points. So, like parts between the control systems according to the first and third embodiments, to which like reference characters are assigned, are omitted or simplified in description.

An abnormal diagnosis routine to be executed by the controller 20 according to the third embodiment will be described hereinafter with reference to FIG. 8 in place of FIG. 3. In FIG. 8, like operations between the routines in FIGS. 3 and 8, to which like numbered steps are assigned, are omitted in description. The controller 20 repeatedly executes the abnormal diagnosis routine in a preset cycle, such as in a cycle of a preset electric angle.

Note that the abnormal diagnosis routine illustrated in FIG. 8 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 8, it is omitted in description.

When launching the abnormal diagnosis routine at a present cycle (n), the controller 20 samples a pair of measured values iua(n) and iub(n) from the respective current sensors 30a and 30b at the present cycle (n) in step S10.

In the respective steps S10 of the previous cycles, plural pairs of measured values iua(n−m−1) and iub (n−m−1), measured values iua(n−m) and iub (n−m), . . . , and measured values iua(n−1) and iub (n−1) have been sampled from the respective current sensors 30a and 30b.

Thus, in step S24, the controller 20 calculates the sum of the number m of the gradients SL(k) {k=n−m, . . . , n}, and calculates the average I of the sum of the number m of the gradients SL(k) {K=n=m, . . . , n} in the following equation:

$$I = \sum_{k=n-m}^{n} \frac{1}{m} \frac{iub(k) - iub(k-1)}{iua(k) - iua(k-1)}$$

Next, in step S26, the controller 20 determines whether the calculated average I is equal to or greater than 1−δ or is equal to or smaller than 1+δ.

Upon determining that the deviation of the average I from "1" is equal to or smaller than the threshold value δ (YES in step S26), the controller 20 diagnoses that there are no abnormalities in each of the current sensors 30a and 30b in step S14. In other words, the controller 20 determines that each of the current sensors 30a and 30b is a normal current sensor in step S14.

Otherwise, upon determining that the deviation of the average I from "1" is greater than the threshold value δ (NO in step S26), the controller 20 diagnoses that there is an abnormality in at least one of the current sensors 30a and 30b in step S16.

After completion of the operation in step S14 or S16, the controller 20 proceeds to step S18a. In step S18a, the controller 20 regards the plural pairs of measured values iua(n−m) and iub (n−m), measured values iua(n−m+1) and iub (n−m+1), and measured values iua(ri) and iub (n) as the plural pairs of measured values iua(n−m−1) and iub (n−m−1), measured values iua(n−m) and iub (n−m), . . . , and measured values iua(n−1) and iub (n−1). In other words, the controller 20 decrements the sampling number (n−m), (n−m+1), . . . , or (n) of each of the measured values by 1 in step S18a. Then, in step S18a, the controller 18 stores the plural pairs of measured values iua(n−m−1) and iub (n—m−1), measured values iua(n−m) and iub (n−m), and measured values iua(n−1) and iub (n−1) therein, exiting the abnormal diagnosis routine.

As described above, the control system according to the third embodiment is configured to, even if noise or the like enters in the output of at least one of the current sensors 30a and 30b so that determinations, each representing that the deviation of the gradient SL(n) from "1" is erroneously greater than the threshold value δ, are repeated at a given number of times, prevent the determination that there is an abnormality in at least one of the current sensors 30a and 30b.

Fourth Embodiment

A control system according to the fourth embodiment of the present invention will be described hereinafter with reference to FIG. 9.

The structure of the control system according to the fourth embodiment is substantially identical to that of the control system CS according to the first embodiment except for the following different points. So, like parts between the control systems according to the first and fourth embodiments, to which like reference characters are assigned, are omitted or simplified in description.

An abnormal diagnosis routine to be executed by the controller 20 according to the fourth embodiment will be described hereinafter with reference to FIG. 9 in place of FIG. 3. In FIG. 9, like operations between the routines in FIGS. 3 and 9, to which like numbered steps are assigned, are omitted in description. The controller 20 repeatedly executes the abnormal diagnosis routine in a preset cycle, such as in a cycle of a preset electric angle.

Note that the abnormal diagnosis routine illustrated in FIG. 9 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 9, it is omitted in description.

When launching the abnormal diagnosis routine at a present cycle (n), the controller 20 carries out the sampling operation in step S10 set forth above.

Next, the controller 20 determines whether the denominator of the equation (fractional equation) to calculate the gradient SL(n) set forth above is unequal to zero in step S28. Specifically, in step S28, the controller 20 determines whether the subtraction of the measured value iua(n−1) from the measured value iua(n) is not zero.

Upon determining that the denominator of the equation to calculate the gradient SL(n) is unequal to zero (YES in step S28), the controller 20 calculates the gradient SL(n) in the equation set forth above in step S12. Otherwise, upon determining that the denominator of the equation to calculate the gradient SL(n) is equal to zero (NO in step S28), the controller 20 goes to step S18 while skipping the operations in steps S12 to S14, in other words, without calculating the gradient SL(n).

As described above, the control system according to the fourth embodiment can determine whether the calculation of the gradient SL(n) is impossible.

Fifth Embodiment

A control system according to the fifth embodiment of the present invention will be described hereinafter with reference to FIG. 10.

The structure of the control system according to the fifth embodiment is substantially identical to that of the control system CS according to the first embodiment except for the following different points. So, like parts between the control systems according to the first and fifth embodiments, to which like reference characters are assigned, axe omitted or simplified in description.

An abnormal diagnosis routine to be executed by the controller 20 according to the fifth embodiment will be described hereinafter with reference to FIG. 10 in place of FIG. 3. In FIG. 10, like operations between the routines in FIGS. 3 and 10, to which like numbered steps are assigned, are omitted in description. The controller 20 repeatedly executes the abnormal diagnosis routine in a preset cycle, such as in a cycle of a preset electric angle.

Note that the abnormal diagnosis routine illustrated in FIG. 10 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 10, it is omitted in description.

When launching the abnormal diagnosis routine at a present cycle (n), the controller 20 carries out the sampling operation in step S10 set forth above.

Next, the controller 20 calculates a gradient SL(n) of a line in step S12a; this line passes through: the measured values iua(n) and iub(n) sampled from the respective current sensors 30a and 30b at the present cycle (n), and the measured values iua(n−2) and iub(n−2) sampled from the respective current sensors 30a and 30b at the second previous cycle (n−2). These measured values iua(n−2) and iub(n−2) have been stored in step S18b in the second previous cycle described later.

Specifically, in step S12a, the controller 20 calculates the gradient SL(n) of the line in the following equation:

$$SL(n) = \frac{iub(n) - iub(n-2)}{iua(n) - iua(n-2)}$$

That is, the controller 20 is configured to calculate the gradient SL(n) of the line passing through a set of temporally nonadjacent one pair P(n) of measured values iua(n) and iub(n) and alternative pair P(n−2) of measured values iua(n−2) and iub(n−2) of the current sensors 30a and 30b.

The configuration can define the gradient SL(n) even if one pair P(n) of measured values and an alternative pair P(n−1) of measured values of the current sensors 30a and 30b, which are temporally adjacent to each other, are identical to each other when, for example, these points P(n) and P(n−1) are close to a local maximum point or a local minimum point of the sinusoidal U-phase current.

Then, in step S12a, the controller 20 determines whether the calculated gradient SL(n) is equal to or greater than 1−δ or is equal to or smaller than 1+δ; δ is a threshold value. If the deviation of the gradient SL(n) from "1" is equal to or smaller than the threshold value δ (YES in step S12a), the controller 20 diagnoses that there are no abnormalities in each of the current sensors 30a and 30b in step S14. In other words, the controller 20 determines that each of the current sensors 30a and 30b is a normal current sensor in step S14.

Otherwise, if the deviation of the gradient SL(n) from "1" is greater than the threshold value δ (NO in step S12a), the controller 20 diagnoses that there is an abnormality in at least one of the current sensors 30a and 30b in step S16.

After completion of the operation in step S14 or S16, the controller 20 regards the measured values iua(n) and iub(n) sampled at the present cycle (n) as the measured values iua(n−1) and iub(n−1) sampled at the previous cycle (n−1) in step S18b. In addition, the controller 20 regards the measured values iua(n−1) and iub(n−1) sampled at the previous cycle (n−1) as the measured values iua(n−2) and iub(n−2) sampled at the second previous cycle (n−2) in step S18b.

As described above, the control system according to the fifth embodiment is configured to diagnose whether there is an abnormality in at least one of the current sensors 30a and 30b (32a and 32b) using the gradient SL(n) of the line (trajectory) passing through a set of temporally nonadjacent one pair of measured values and alternative pair of measured values of the current sensors 30a and 30b.

This configuration can achieve, in addition to the first and second technical effects, the fourth technical effect of defining the gradient SL(n) even if at least one of measured values of the current sensors 30a and 30b at one sampling timing and a corresponding at least one measured values thereof at a temporally next sampling timing are identical to each other.

Sixth Embodiment

A control system according to the sixth embodiment of the present invention will be described hereinafter with reference to FIG. 11.

The structure of the control system according to the sixth embodiment is substantially identical to that of the control system CS according to the first embodiment except for the following different points. So, like parts between the control systems according to the first and sixth embodiments, to which like reference characters are assigned, are omitted or simplified in description.

An abnormal diagnosis routine to be executed by the controller 20 according to the sixth embodiment will be described hereinafter with reference to FIG. 11 in place of FIG. 3. In FIG. 11, like operations between the routines in FIGS. 3 and 11, to which like numbered steps are assigned, are omitted in description. The controller 20 repeatedly executes the abnormal diagnosis routine in a preset cycle, such as in a cycle of a preset electric angle.

Note that the abnormal diagnosis routine illustrated in FIG. 11 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 11, it is omitted in description.

When launching the abnormal diagnosis routine at a present cycle (n), the controller 20 carries out the sampling operation in step S10 set forth above.

Next, the controller 20 calculates a gradient SL(n) of a line in step S12b using: the measured values iua(n) and iub(n) sampled from the respective current sensors 30a and 30b at the present cycle (n), the measured values iua(n−1) and iub(n−1) sampled from the respective current sensors 30a and 30b at the previous cycle (n−1), and the measured values iua(n−2) and iub(n−2) sampled from the respective current sensors 30a and 30b at the second previous cycle (n−2).

Specifically, in step S12b, the controller 20 calculates the gradient SL(n) as an averaged gradient in the following equation:

$$SL(n) = \frac{2iub(n) - iub(n-1) - iub(n-2)}{2iua(n) - iua(n-1) - iua(n-2)}$$

Then, in step S12b, the controller 20 determines whether the calculated gradient SL(n) is equal to or greater than 1−δ or is equal to or smaller than 1+δ; δ is a threshold value. If the deviation of the gradient SL(n) from "1" is equal to or smaller than the threshold value δ (YES in step S12b), the controller 20 diagnoses that there are no abnormalities in each of the current sensors 30a and 30b in step S14. In other words, the controller 20 determines that each of the current sensors 30a and 30b is a normal current sensor in step S14.

Otherwise, if the deviation of the gradient SL(n) from "1" is greater than the threshold value δ (NO in step S12b), the controller 20 diagnoses that there is an abnormality in at least one of the current sensors 30a and 30b in step S16.

After completion of the operation in step S14 or S16, the controller 20 regards the measured values iua(n) and iub(n) sampled at the present cycle (n) as the measured values iua(n−1) and iub(n−1) sampled at the previous cycle (n−1) in step S18b. In addition, the controller 20 regards the measured values iua(n−1) and iub(n−1) sampled at the previous cycle (n−1) as the measured values iua(n−2) and iub(n−2) sampled at the second previous cycle (n−2) in step S18b.

As described above, the control system according to the sixth embodiment can define the gradient SL(n) even if at least one of measured values of the current sensors 30a and 30b at one sampling timing and a corresponding at least one measured values thereof at a temporally next sampling timing are identical to each other.

Seventh Embodiment

A control system according to the seventh embodiment of the present invention will be described hereinafter with reference to FIGS. 12 and 13.

The structure of the control system according to the seventh embodiment is substantially identical to that of the control system CS according to the first embodiment except for the following different points. So, like parts between the control systems according to the first and seventh embodiments, to which like reference characters are assigned, are omitted or simplified in description.

The control system CS according to the first embodiment is configured to diagnose whether there is an amplitude shift as an abnormality (gain abnormality) in at least one of the current sensors 30a and 30b. That is, the control system CS according to the first embodiment is configured to diagnose there is an abnormality of the change in the magnitude (amplitude) of a measured value of at least one of the current sensors 30a and 30b.

In addition to the configuration, the control system according to the seventh embodiment is configured to diagnose whether there is an offset abnormality in at least one of the current sensors 30a and 30b as illustrated in FIG. 12. The "offset abnormality" means that each measured current value of a current sensor contains an offset component so that an output characteristic curve of a current sensor (see a chain double-dashed line in FIG. 12) is constantly offset relative to the normal output characteristic curve of a normal current sensor (see a solid line in FIG. 12).

If there is an offset abnormality in at least one of the current sensors 30a and 30b, the configuration of the control system CS according to the first embodiment may not diagnose it. Thus, the control system according to the seventh embodiment is configured to allow determination of whether there is an offset abnormality in at least one of the current sensors 30a and 30b based on a distance between:

a line with the gradient of 1 as the trajectory passing through a plurality of sequential pairs of measured values of the current sensors 30a and 30b if they are normal; and actually sampled measured values of the current sensors 30a and 30b.

An abnormal diagnosis routine to be executed by the controller 20 according to the seventh embodiment will be described hereinafter with reference to FIG. 13 in addition to FIG. 3. In FIG. 13, like operations between the routines in FIGS. 3 and 13, to which like numbered steps are assigned, are omitted in description. The controller 20 repeatedly executes the abnormal diagnosis routine illustrated in FIG. 13 each time it is determined that there are no abnormalities (no amplitude-shift abnormalities, that is, gain abnormalities) in each of the current sensors 30a and 30b in the abnormal diagnosis routine illustrated in FIG. 3.

Note that the abnormal diagnosis routine illustrated in FIG. 13 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 13, it is omitted in description.

When launching the abnormal diagnosis routine at a present cycle (n), the controller 20 carries out the sampling operation in step S10 set forth above.

Next, the controller 20 determines whether the distance between a point of the measured values iua(n) and iub(n) sampled from the respective current sensors 30a and 30b at the present cycle (n) and a line with the gradient of 1 is equal to or shorter than a preset distance in step S30.

Specifically, in step S30, the controller 20 determines whether an absolute value of the difference between the measured value iua(n) and the measured value iub(n) is equal to or lower than a threshold value h. The absolute value of the difference between the measured value iua(n) and the measured value iub(n) is a variable proportional to the distance set forth above.

Upon determining that the absolute value of the difference is equal to or lower than the threshold value h (YES in step S30), the controller 20 diagnoses that there are no offset abnormalities in each of the current sensors 30a and 30b in step S14. In other words, the controller 20 determines that each of the current sensors 30a and 30b is a normal current sensor in step S14.

Otherwise, upon determining that the absolute value of the difference is higher than the threshold value h (NO in step S30), the controller 20 diagnoses that there is an offset abnormality in at least one of the current sensors 30a and 30b in step S32.

As described above, the control system according to the seventh embodiment is configured to diagnose whether there is an offset abnormality in at least one of the current sensors 30a and 30b. This configuration can achieve, in addition to the first to third technical effects, the fifth technical effect of preventing the determination that there are no abnormalities in each of the current sensors 30a and 30b although there is an offset abnormality in at least one of the current sensors 30a and 30b.

Eighth Embodiment

A control system according to the eighth embodiment of the present invention will be described hereinafter with reference to FIG. 14.

The structure of the control system according to the eighth embodiment is substantially identical to that of the control system CS according to the first embodiment except for the following different points. So, like parts between the control systems according to the first and eighth embodiments, to which like reference characters are assigned, are omitted or simplified in description.

An abnormal diagnosis routine to be executed by the controller 20 according to the eighth embodiment will be described hereinafter with reference to FIG. 14 in place of FIG. 3. In FIG. 14, like operations between the routines in FIGS. 3 and 14, to which like numbered steps are assigned, are omitted in description. The controller 20 repeatedly executes the abnormal diagnosis routine in a preset cycle, such as in a cycle of a preset electric angle.

Note that the abnormal diagnosis routine illustrated in FIG. 14 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 14, it is omitted in description.

When launching the abnormal diagnosis routine at a present cycle (n), the controller 20 carries out the sampling operation in step S10 set forth above.

Next, the controller 20 calculates a simple regression line in step S34. The simple regression line is represented by the following simple regression equation: $B = k \cdot A + const$ where B is an objective variable (dependent variable), A is an explanatory variable (independent variable), k is a coefficient (gradient), and const is a constant value (vertical-axis intercept). A variable of the measured values of the current sensor 30a is the objective variable B, and a variable of the measured values of the current sensor 30b is the explanatory variable A.

Specifically, in step S34, the controller 20 calculates the coefficient k and the constant value const based on a plurality of sequential pairs of measured values iua(n) and iub(n), iua(n−1) and iub(n−1), . . . sampled from the current sensors 30a and 30b using, for example, a known least squares method.

Next, in step S36, the controller 20 determines whether a logical AND between: the deviation of the coefficient k from "1" being equal to or smaller than, the threshold value $\delta$, and an absolute value of the constant value const being equal to or lower than a threshold value Cth is true. The determination in step S36 is to diagnose whether there is an abnormality in at least one of the current sensors 30a and 30b based on the degree of a divergence between the simple regression line and a reference line having the gradient of 1 and passing through the origin point of the two-dimensional coordinate system.

Upon determining that the logical AND is true (YES in step S36), the controller 20 diagnoses that there are no abnormalities in each of the current sensors 30a and 30b in step S14. In other words, the controller 20 determines that each of the current sensors 30a and 30b is a normal current sensor in step S14.

Otherwise, upon determining that the logical AND is false (NO in step S36), the controller 20 diagnoses that there is an abnormality in at least one of the current sensors 30a and 30b in step S16.

After completion of the operation in step S14 or S16, the controller 20 carries out the operation in step S18a set forth above.

As described above, the control system according to the eighth embodiment is configured to diagnose whether there is an abnormality in at least one of the current sensors 30a and 30b based on the degree of the divergence between the simple regression line and the reference line. Because of using the simple regression line between the variable of the measured values of the current sensor 30a and that of the measured values of the current sensor 30b, this configuration can achieve, in addition to the first and second technical effects, the sixth technical effect of implementing the abnormal diagnosis with a high resistance against noise.

Ninth Embodiment

A control system according to the ninth embodiment of the present invention will be described hereinafter with reference to FIGS. 15 to 17.

The structure of the control system according to the ninth embodiment is substantially identical to that of the control system according to the eighth embodiment except for the following different points. So, like parts between the control systems according to the eighth and ninth embodiments, to which like reference characters are assigned, are omitted or simplified in description.

(a) of FIG. 15 schematically illustrates, when a corresponding phase current has a low amplitude, the transition of the measured values from a normal current sensor, that is, the normal output characteristic curve of the normal current sensor, and the transition of the measured values from an abnormal current sensor with an amplitude shift (an increased gain), that is an output characteristic curve of the abnormal current sensor with the amplitude shift (the increased gain).

(b) of FIG. 15 schematically illustrates the normal output characteristic curve of the nor mal current sensor, a characteristic curve of cyclically oscillating noise, and the normal output characteristic curve of the normal current sensor on which the characteristic curve of cyclically oscillating noise is superimposed when a corresponding phase current has a low amplitude. (c) of FIG. 15 schematically illustrates the normal output characteristic curve of the normal current sensor on which the characteristic curve of cyclically oscillating noise is superimposed, and the output characteristic curve of the abnormal current sensor with the amplitude shift (increased gain).

(c) of FIG. 15 clearly shows that it may be difficult to distinguish the output characteristic curve with the increased gain from the normal output characteristic curve on which the characteristic curve of cyclically oscillating noise is superimposed.

In fact, the simple regression line calculated based on a plurality of sequential pairs of measured values sampled from a normal current sensor in noisy environment and that calculated based on a plurality of sequential pairs of measured values sampled from an abnormal current sensor with an increased gain are substantially matched with each other (see FIG. 16).

In view of the aforementioned circumstances, the control system according to the ninth embodiment is configured to prevent diagnosis of abnormalities in at least one of the current sensors 30a and 30b if the U-phase current has a low amplitude.

An abnormal diagnosis routine to be executed by the controller 20 according to the ninth embodiment will be described hereinafter with reference to FIG. 17 in place of FIG. 14. In FIG. 17, like operations between the routines in FIGS. 14 and 17, to which like numbered steps are assigned, are omitted in description. The controller 20 repeatedly executes the abnormal diagnosis routine in a preset cycle, such as in a cycle of a preset electric angle.

Note that the abnormal diagnosis routine illustrated in FIG. 17 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 17, it is omitted in description.

When launching the abnormal diagnosis routine at a present cycle (n), the controller 20 carries out the sampling operation in step S10 set forth above.

Next, the controller 20 determines whether the amplitude of the U-phase current is equal to or higher than a threshold amplitude Iath based on for example, the sampled values iua(n) and iub(n) in step S38.

Upon determining that the amplitude of the U-phase current is equal to or higher than the threshold amplitude Iath (YES in step S38), the controller 20 carries out the following operations in steps S34, S36, S14 (S16), and S18a set forth above.

Otherwise, upon determining that the amplitude of the U-phase current is lower than the threshold amplitude Iath (NO in step S38), the controller 20 exits the abnormal diagnosis routine without executing the following operations in steps S34, S36, S14 (S16), and S18a.

As described above, the control system according to the ninth embodiment is configured to prevent the diagnosis of whether there is an abnormality in at least one of the current sensors 30a and 30b if the U-phase current has an amplitude lower than the threshold amplitude.

This configuration can achieve, in addition to the first, second, and sixth technical effects, the seventh technical effect of preventing abnormal diagnoses with low accuracy.

Tenth Embodiment

A control system according to the tenth embodiment of the present invention will be described hereinafter with reference to FIG. 18.

The structure of the control system according to the tenth embodiment is substantially identical to that of the control system according to the eighth embodiment except for the following different points. So, like parts between the control systems according to the eighth and tenth embodiments, to which like reference characters are assigned, are omitted or simplified in description.

An abnormal diagnosis routine to be executed by the controller 20 according to the tenth embodiment will be described hereinafter with reference to FIG. 18 in place of FIG. 14. In FIG. 18, like operations between the routines in FIGS. 14 and 18, to which like numbered steps are assigned, are omitted in description. The controller 20 repeatedly executes the abnormal diagnosis routine in a preset cycle, such as in a cycle of a preset electric angle.

Note that the abnormal diagnosis routine illustrated in FIG. 18 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 18, it is omitted in description.

When launching the abnormal diagnosis routine at a present cycle (n), the controller 20 carries out the sampling operation in step S10 set forth above.

Next, the controller 20 calculates a simple regression line passing through a specific point (a, b) in the two-dimensional coordinate system whose horizontal and vertical axes respectively represent the measured values of the current sensor 30a and the measured values of the current sensor 30b in step S34a. The specific point (a, b) is defined such that the horizontal-axis component "a" is equal to the vertical-axis component "b", and a current value corresponding to the specific point (a, b) in the two-dimensional coordinate system is sufficiently higher than the maximum current that can flow in the motor-generator 10 within its operating range.

Specifically, in step S34a, the controller 20 calculates the simple regression line represented by the following simple regression equation; B–b k·(A–a). That is, the simple regression equation is represented by: B=kA+(b–ka).

The operation in step S34a could aim to prevent the reduction in the diagnostic accuracy if noise were concentrically superimposed on at least one pair of measured values of the current sensors 30a and 30b away from the origin point. That is, in calculating the simple regression equation using a known least squares method, at least one pair of measured values of the current sensors 30a and 30b away from the origin point may affect on the calculated simple regression equation. Thus, if noise were concentrically superimposed on at least one pair of measured values of the current sensors 30a and 30b away from the origin point, the noise would have a large influence on the accuracy of the calculated simple regression equation, resulting in a reduced diagnostic accuracy of the control system.

However, the operation in step S34a could effectively prevent the influence of the noise on the accuracy of the calculated simple regression equation.

Following the operation in step S34a, the controller 20 determines whether a logical AND between: the deviation of the coefficient (gradient) k from "1" being equal to or smaller than the threshold value δ, and an absolute value of the vertical-aids intercept (the subtraction of ka from b) being equal, to or lower than the threshold value Cth is true.

Upon determining that the logical AND is true (YES in step S36a), the controller 20 diagnoses that there are no abnormalities in each of the current sensors 30a and 30b in step S14. In other words, the controller 20 determines that each of the current sensors 30a and 30b is a normal current sensor in step S14.

Otherwise, upon determining that the logical AND is false (NO in step S36a), the controller 20 diagnoses that there is an abnormality in at least one of the current sensors 30a and 30b in step S16.

As described above, the control system according to the tenth embodiment is configured to calculate the simple regression line passing through a specific point in the two-dimensional coordinate system; a current value corresponding to the specific point in the two-dimensional coordinate system cannot flow in the motor-generator 10 within its operating range. Thus, the configuration can achieve, in addition to the first, second, and sixth technical effects, the eighth technical, effect of effectively reducing the affect of noise on the diagnostic accuracy of the control system according to the tenth embodiment Eleventh Embodiment A control system according to the eleventh embodiment of the present invention will be described hereinafter with reference to FIGS. 19 and 20.

The structure of the control system according to the eleventh embodiment is substantially identical to that of the control system CS according to the first embodiment except for the following different points. So, like parts between the control systems according to the first and eleventh embodiments, to which like reference characters are assigned, are omitted or simplified in description.

The control system CS according to the first embodiment is configured to diagnose whether there is an amplitude shift as an abnormality (gain abnormality) in at least one of the current sensors 30a and 30b. That is, the control system CS according to the first embodiment is configured to diagnose there is an abnormality of the change in the magnitude (amplitude) of a measured value of at least one of the current sensors 30a and 30b.

In addition to the configuration, the control system according to the eleventh embodiment is configured to diagnose whether there is a phase-shift abnormality in at least one of the current sensors 30a and 30b as illustrated in FIG. 19. As illustrated in (a) of FIG. 19, the phase-shift abnormality means that an output characteristic curve of a current sensor (see a chain double-dashed line in (a) of FIG. 19) is out of phase with the normal output characteristic curve of a normal current sensor (see a solid line in (a) of FIG. 19).

If there is a phase-shift abnormality in at least one of the current sensors 30a and 30b, the trajectory of a plurality of sequential pairs of measured values of the current sensors 30a and 30b has a substantially elliptical shape as illustrated in (b) of FIG. 19. Thus, the control system according to the eleventh embodiment is configured to diagnose whether there is a phase-shift abnormality in at least one of the current sensors 30a and 30b by determining whether the trajectory of a plurality of sequential pairs of measured values of the current sensors 30a and 30b has a substantially elliptical shape.

An abnormal diagnosis routine to be executed by the controller 20 according to the eleventh embodiment will be described hereinafter with reference to FIG. 20 in addition to FIG. 3. In FIG. 20, like operations between the routines in FIGS. 3 and 20, to which like numbered steps are assigned, are omitted in description. For example, the controller 20 repeatedly executes the abnormal diagnosis routine illustrated in FIG. 20 each time it is determined that there are no abnormalities in each of the current sensors 30a and 30b in the abnormal diagnosis routine illustrated in FIG. 3.

Note that the abnormal diagnosis routine illustrated in FIG. 20 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 20, it is omitted in description.

When launching the abnormal diagnosis routine at a present cycle (n), the controller 20 carries out the sampling operation in step S10 set forth above.

Next, the controller 20 calculates the gradient SL(n) of a line in step S40; this line passes through the measured values iua(n) and iub(n) sampled from the respective current sensors 30a and 30b at the present cycle (n), and the measured values iua(n–1) and iub(n–1) sampled from the respective current sensors 30a and 30b at the previous cycle (n–1).

Following the operation in step S40, the controller 20 calculates a unit vector (gradient vector) e(n) with the gradient SL(n) in step S42. Specifically, the controller 20 calculates the unit vector e(n) in accordance with the following equation:

$$e(n) = \frac{SL(n)}{|SL(n)|}$$

In step S44, the controller 20 calculates an inner product of the unit vector e(n) calculated in step S42 at the present cycle (n) and the unit vector e(n–1) calculated in step S42 at the previous cycle (n–1). The operation in step S42 calculates a parameter having a correlation to the angle θ between the presently calculated gradient SL(n) and the previously calculated gradient SL(n−1). That is, the inner product of the present unit vector e(n) and the previous unit vector e(n−1) represents a cosine function cos θ (n) of the angular variable θ.

Next, in step S46, the controller 20 determines whether a phase lag grasped by the cosine function cos θ (n) is within an allowable range.

That is, if a phase-shift abnormality has occurred in at least one of the current sensors 30a and 30b, the cosine function cos θ may be changed over time. Thus, the controller 20 can determine whether there is a phase shift abnormality in at least one of the current sensors 30a and 30b based on the trajectory of the cosine function cos θ over time.

Specifically, in step S46, the controller 20 grasps the transient of the gradients SL(n), SL(n−1), ..., and SL(n−k) based on the time series data of the cosine functions cos θ (n), cos θ (n−1), ..., and cos θ (n−k) calculated in step S44 at a preset number k of previous cycles and the present cycle, and determines whether the grasped transient has a substantially elliptical shape.

Upon determining that the phase lag is within the allowable range by determining that the grasped transient does not have a substantially elliptical shape (YES in step S46), the controller 20 diagnoses that there are no phase-shift abnormalities in each of the current sensors 30a and 30b in step S14. In other words, the controller 20 determines that each of the current sensors 30a and 30b is a not final current sensor in step S14.

Otherwise, upon determining that the phase lag is out of the allowable range by determining that the grasped transient has a substantially elliptical shape (NO in step S46), the controller 20 diagnoses that there is a phase-shift abnormality in at least one of the current sensors 30a and 30b in step S32.

After completion of the operation in step S14 or S16, the controller 20 proceeds to step S50. In step S50, the controller 20 decrements the sampling numbers (n), (n−1), ..., and (n−k+1) of the respective pairs of the measured values by 1, and decrements, by 1, the sampling numbers (n), (n−1), ..., and (n−k+1) of the respective gradients SL(n), SL(n−1), ..., and SL(n−k+1), the unit vectors e(n), e(n−1), ..., and e(n−k+1), and the cosine functions cos θ (n), cos θ (n−1), ..., and cos θ (n−k+1) in step S50. Then, in step S50, the controller 18 stores therein the decremented data, exiting the abnormal diagnosis routine.

As described above, the control system according to the eleventh embodiment can achieve, in addition to the first technical effect, the ninth technical effect of implementing the diagnosis of whether there is a phase-shift abnormality in at least one of the current sensors 30a and 30b based on the angles each between a corresponding pair of temporally adjacent gradients.

Twelfth Embodiment

A control system according to the twelfth embodiment of the present invention will be described hereinafter with reference to FIG. 21.

The structure of the control system according to the twelfth embodiment is substantially identical to that of the control system according to the eleventh embodiment except for the following different points. So, like parts between the control systems according to the eleventh and twelfth embodiments, to which like reference characters are assigned, are omitted or simplified in description.

An abnormal diagnosis routine to be executed by the controller 20 according to the twelfth embodiment will be described hereinafter with reference to FIG. 21 in addition to FIG. 3. In FIG. 21, like operations between the routines in FIGS. 3 and 21, to which like numbered steps are assigned, are omitted in description. For example, the controller 20 repeatedly executes the abnormal diagnosis routine illustrated in FIG. 21 each time it is determined that there are no abnormalities in each of the current sensors 30a and 30b in the abnormal diagnosis routine illustrated in FIG. 3.

Note that the abnormal diagnosis routine illustrated in FIG. 21 is a routine for diagnosing whether there is an abnormality in each of the current sensors 30a and 30b for the U-phase current. Because the abnormal diagnosis routine for diagnosing whether there is an abnormality in each of the current sensors 32a and 32b for the V-phase current is identical to the abnormal diagnosis routine illustrated in FIG. 21, it is omitted in description.

When launching the abnormal diagnosis routine at a present cycle (n), the controller 20 carries out the operations in steps S10, S40, and S42 set forth above.

Next, the controller 20 determines whether ones of the unit vectors (gradient vectors) calculated in step S42 at a preset number of previous cycles and the present cycle in step S46a are within a preset allowable range; these pieces of the time series data is within a preset period in step S46a.

Specifically, in step S46a, the controller 20 determines whether the median (or average) of the ones of the unit vectors during N periods of electric angle (N=1, 2, 3, ... ), or the highest frequency of one of the unit vectors during the N periods of electric angle is within the allowable range.

This determination in step S46a is based on the fact that an ellipse has a unique median and a unique average in a plurality of gradients (gradient vectors) of tangents thereto, and a unique highest frequency of a gradient in the plurality of gradients of the tangents thereto.

That is, if the median (or average) of the ones of the unit vectors during the N periods of electric angle is close to the unique median (or unique average) for an ellipse, the controller 20 determines that the ones of the unit vectors (gradient vectors) are not within the preset allowable range (NO in step S46a). Similarly, if the highest frequency of one of the unit vectors is close to the unique highest frequency of one gradient for an ellipse, the controller 20 determines that the ones of the unit vectors (gradient vectors) are not within the preset allowable range (NO in step S46a). Then, the controller 20 determines that there is a phase-shift abnormality in at least one of the current sensors 30a and 30b in step S48.

Otherwise, if the median (or average) of the ones of the unit vectors during the N periods of electric angle is not close to the unique median (or unique average) for an ellipse, the controller 20 determines that the pieces of the unit vectors (gradient vectors) are within the preset allowable range (YES in step S46a). Similarly, if the highest frequency of one of the unit vectors is not close to the unique highest frequency of one gradient for an ellipse, the controller 20 determines that the pieces of the unit vectors (gradient vectors) are within the preset allowable range (YES in step S46a). Then, the controller 20 determines that there are no phase-shift abnormalities in each of the current sensors 30a and 30b in step S14. In other words, the controller 20 determines that each of the current sensors 30a and 30b is a normal current sensor in step S14.

In step S46a, the controller 20 can determine whether the distribution of the ones of the unit vectors during the N periods of electric angle or the variance of the ones of the unit vectors during the N periods of electric angle is within the allowable range. This determination in step S46a is based on the fact that an ellipse has a unique distribution or a unique variance of a plurality of gradients (gradient vectors) of tangents thereto.

Thus, if the distribution or variance of the ones of the unit vectors during the N periods of electric angle is close to the unique distribution or the unique variance for an ellipse, the controller 20 determines that the ones of the unit vectors are not within the preset allowable range (NO in step S46a). Then, the controller 20 determines that there is a phase-shift abnormality in at least one of the current sensors 30a and 30b in step S48.

Otherwise, if the distribution or variance of the ones of the unit vectors during the N periods of electric angle is not close to the unique distribution or the unique variance for an ellipse, the controller 20 determines that the ones of the unit vectors are within the preset allowable range (YES in step S46a). Then, the controller 20 determines that there are no phase-shift abnormalities in each of the current sensors 30a and 30b in step S14. In other words, the controller 20 determines that each of the current sensors 30a and 30b is a normal current sensor in step S14.

As described above, the control system according to the twelfth embodiment can achieve, in addition to the first technical effect, the tenth technical effect of implementing the diagnosis of whether there is a phase-shift abnormality in at least one of the current sensors 30a and 30b based on the gradients SL during a preset period.

Thirteenth Embodiment

A control system CS1 according to the thirteenth embodiment of the present invention will be described hereinafter with reference to FIGS. 22 and 23.

FIG. 22 schematically illustrates the structure of the control system CS1 according to the thirteenth embodiment. Like parts between the control systems CS and CS1 according to the first and thirteenth embodiments, to which like reference characters are assigned, are omitted or simplified in description.

The control system CS1 includes a current sensor provided for each phase of the motor-generator 10 in place of the current sensors 30a and 30b and 32a and 32b.

Specifically, the control system CS1 includes a current sensor 30 provided for the U-phase winding U, a current sensor 32 for the V-phase winding V, and a current sensor 34 provided for the W-phase winding W.

The current sensor 30 is operative to measure values of the U-phase current flowing through the U-phase winding U and to output the measured values to the controller 20. The current sensor 32 is operative to measure values of the V-phase current flowing through the V-phase winding V and to output the measured values to the controller 20. The current sensor 34 is operative to measure values of the W-phase current flowing through the W-phase winding W and to output the measured values to the controller 20.

Note that the trajectory of a plurality of sequential pairs of measured values of the current sensors 30 and 32 to be plotted in a two-dimensional coordinate system whose horizontal and vertical axes respectively represent the measured values of the current sensor 30 and the measured values of the current sensor 32 has an elliptical shape (normal ellipsoidal trajectory) if no abnormalities has occurred in each of the current sensors 30 and 32. This is because the U- and V-phase windings U and V have a relative phase shift of 120 degrees so that the U-phase current and V-phase current to be supplied to the respective U- and V-phase windings U and V have a same amplitude and a same cycle and a fixed phase shift based on the relative phase shift of 120 degrees relative to each other. The normal ellipsoidal trajectory can be estimated based on the fixed phase shift between the U-phase current and V-phase current.

That is, the control system CS1 according to the thirteenth embodiment is configured to diagnose whether there is an abnormality in at least one of the current sensors 30, 32, and 34 based on a phase shift of a plurality of sets of the measured values by the current sensors 30, 32, and 34 relative to the normal elliptical trajectory.

An abnormal diagnosis routine to be executed by the controller 20 according to the thirteenth embodiment will be described hereinafter with reference to FIG. 23. For example, the controller 20 repeatedly executes the abnormal diagnosis routine illustrated in FIG. 23 in a preset cycle, such as in a cycle of a preset electric angle.

Note that the abnormal diagnosis routine illustrated in FIG. 23 is a routine for diagnosing whether there is an abnormality in each of the current sensors 30 and 32 for the U- and V-phase currents. Because the abnormal diagnosis routine for diagnosing whether there is an abnormality in the current sensor 34 for the W-phase current is identical to the abnormal diagnosis routine illustrated in FIG. 23 as long as the current sensor 30 or 32 is replaced with the current sensor 34, it is omitted in description.

When launching the abnormal diagnosis routine at a present cycle (n), the controller 20 samples a measured value iu(n) of the U-phase current from the current sensor 30, and a measured value iv(n) of the V-phase current from the current sensor 32 at the present cycle (n) in step S60.

Next, the controller 20 obtains output torque T of the motor-generator 10 and an electric angular velocity ω of the rotor of the motor-generator 10 based on, for example, the measured rotation angles of the angle sensor 40 in step S62.

Subsequently, the controller 20 variably determines a pair of focal points F1 (U1, V1) and F2 (U2, V2) for a normal elliptical trajectory in the two-dimensional coordinate system according to the output torque T and the electric angular velocity ω in step S64; the normal elliptical trajectory is estimated beforehand based on the fixed phase shift between the U-phase current and V-phase current.

Then, in step S64, the controller 20 calculates the sum L of the distance between the focal point F1 and the measured values iu(n) and iv(u) and that between the focal point F2 and the measured values iu(n) and iv(n).

Specifically, in step S64, the controller 20 calculates the sum L of the distance between the focal point F1 and the measured values iu(n) and iv(n) and that between the focal point F2 and the measured values iu(n) and iv(n) in the following equation:

$$L = \sqrt{(iu(n) - U1)^2 + (iv(n) - V1)^2} + \sqrt{(iu(n) - U2)^2 + (iv(n) - V2)^2}$$

This operation in step S64 is to determine whether there is an abnormality in at least one of the current sensors 30 and 32, in other words, whether each of the current sensors 30 and 32 is normal. Specifically, if each of the current sensors 30 and 32 is normal, a plurality of sequential pairs of the measured values of the current sensors 30 and 32 draw an ellipse so that the sum L of the distance from the focal point F1 to the ellipse and that from the focal point F2 thereto is constant.

Note that, because the pair of focal points F1 and F2 is changed with change in the amplitude of each of the U- and V-phase currents, the controller 20 according to the thirteenth embodiment variably determines the pair of focal points F1

(U1, V1) and F2 (U2, V2) according to the torque T and the electric angular velocity ω as parameters correlated with the amplitude of each of the U- and V-phase currents in step S64. Specifically, the controller 20 estimates the amplitude of each of the U- and V-phase currents based on the torque T and the electric angular velocity ω, and variably determines the pair of focal points F1 (U1, V1) and F2 (U2, V2) according to the estimated amplitude of each of the U- and v-phase currents in step S64.

Next, the controller 20 determines whether an absolute value of the difference between a reference sum Lref and the sum L of the distance between the focal point F1 and the measured values iu(n) and iv(n) and that between the focal point F2 and the measured values iu(n) and iv(n) is equal to or lower than a threshold value ΔLth in step S66. In step S66, the controller 20 variably determines the reference sum Lref according to the torque T and the electric angular velocity ω as the parameters correlated with the amplitude of each of the U- and V-phase currents in step S66. That is, in step S66, the controller 20 variably determines the reference sum according to the amplitude of each of the U- and V-phase currents estimated in step S64.

Upon determining that the absolute value of the difference between the reference sum Lref and the sum L of the distance between the focal point F1 and the measured values iu(n) and iv(n) and that between the focal point F2 and the measured values iu(n) and iv(n) is equal to or lower than the threshold value ΔLth (YES in step S66), the controller 20 diagnoses that there are no abnormalities in each of the current sensors 30 and 32 in step S68. In other words, the controller 20 determines that each of the current sensors 30 and 32 is a normal current sensor in step S68.

Otherwise, upon determining that the absolute value of the difference between the reference sum Lref and the sum L of the distance between the focal point F1 and the measured values iu(n) and iv(n) and that between the focal point F2 and the measured values iu(n) and iv(n) is higher than the threshold value ΔLth (NO in step S66), the controller 20 diagnoses that there is an abnormality in at least one of the current sensors 30 and 32 in step S70.

After completion of the operation in step S68 or S70, the controller 20 regards the measured values iu(n) and iv(n) sampled at the present cycle (n) as the measured values iu(n−1) and iv(n−1) sampled at the previous cycle (n−1) in step S72. In other words, the controller 20 decrements the sampling number "n" by 1 in step S72. The controller 20 also stores therein the measured values iu(n−1) and iv(n−1) in step S72, exiting the abnormal diagnosis routine.

As described above, the control system CS1 according to the thirteenth embodiment is configured to diagnose whether there is an abnormality in at least one of a plurality of current sensors based on the degree of the divergence between: the ellipse (normal elliptic trajectory) estimated based on a relative phase shift among different phase currents to be measured by the plurality of current sensors; and a trajectory of measured values of the plurality of current sensors. This configuration can achieve, in addition to the first technical effect, the eleventh technical effect of enabling the diagnosis of whether there is an abnormality in at least one of the current sensors 30 and 32 based on the measured values of the current sensors 30 and 32.

The control system CS1 is configured to execute the diagnosis using the sum L of the distance between the focal point F1 (V1, V1) and a pair of measured values of the current sensors 30 and 32 and the distance between the focal point F2 (U2, V2) and the pair of measured values of the current sensors 30 and 32. This configuration can achieve the twelfth technical effect of grasping the degree of the divergence between the normal elliptical trajectory and a trajectory of measured values of the current sensors 30 and 32.

The control system CS1 is configured to variably determine, according to the state quantities of the motor-generator 10, the ellipse estimated based on a relative phase shift between the U-phase current and V-phase current if each of the current sensors 30 and 32 is normal. This configuration can achieve the thirteenth technical effect of diagnosing whether there is an abnormality in at least one of the current sensors 30 and 32 with high accuracy.

Fourteenth Embodiment

A control system according to the fourteenth embodiment of the present invention will be described hereinafter with reference to FIG. 24.

The structure of the control system according to the fourteenth embodiment is substantially identical to that of the control system CS1 according to the thirteenth embodiment except for the following different points. So, like parts between the control systems according to the thirteenth and fourteenth embodiments, to which like reference characters are assigned, are omitted or simplified in description.

An abnormal diagnosis routine to be executed by the controller 20 according to the fourteenth embodiment will be described hereinafter with reference to FIG. 24 in place of FIG. 23. In FIG. 24, like operations between the routines in FIGS. 23 and 24, to which like numbered steps are assigned, are omitted in description. For example, the controller 20 repeatedly executes the abnormal diagnosis routine illustrated in FIG. 24 in a preset cycle, such as in a cycle of a preset electric angle.

Note that the abnormal diagnosis routine illustrated in FIG. 24 is a routine for diagnosing whether there is an abnormality in each of the current sensors 30 and 32 for the U- and V-phase currents. Because the abnormal diagnosis routine for diagnosing whether there is an abnormality in the current sensor 34 for the W-phase current is identical to the abnormal diagnosis routine illustrated in FIG. 24 as long as the current sensor 30 or 32 is replaced with the current sensor 34, it is omitted in description.

When launching the abnormal diagnosis routine at a present cycle (n), the controller 20 carries out the sampling operation in step S60 set forth above.

Next, the controller 20 carries out a known multivariate analysis, such as a known multivariate regression analysis, using t pairs of measured values of the current sensors 30 and 32 to thereby identify an elliptic trajectory of the plurality of sequential pairs of measured values iu(n) and iv(n), and iv(n−1), . . . , and iu(n−t−1) and iv(n−t−1) of the current sensors 30 and 32 in step S74.

Following the operation in step S74, the controller 20 proceeds to step S76. In step S76, the controller 20 determines whether the difference between the identified elliptic trajectory of the plurality of sequential pairs of measured values of the current sensors 30 and 32 and the ellipse estimated based on a relative phase shift between the U-phase current and V-phase current if each of the current sensors 30 and 32 is normal is within an allowable range.

Upon determining that the difference is within the allowable range (YES in step S76), the controller 20 determines that there are no abnormalities in each of the current sensors 30 and 32 in step S68. In other words, the controller 20 determines that each of the current sensors 30 and 32 is a normal current sensor in step S68.

Otherwise, upon determining that the difference is out of the allowable range (NO in step S76), the controller 20 determines that there is an abnormality in at least one of the current sensors 30 and 32 in step S70.

After completion of the operation in step S68 or S70, the controller 20 proceeds to step S72. In step S72, the controller 20 decrements the sampling numbers (n), (n−1), . . . , and (n−t) of the respective pairs of the measured values by 1. Then, in step S72, the controller 18 stores therein the decremented data exiting the abnormal diagnosis routine.

As described above, the control system according to the fourteenth embodiment is configured to identify the elliptic trajectory of the plurality of sequential pairs of measured values of the current sensors 30 and 32. This configuration can achieve the thirteenth technical effect of diagnosing whether there is an abnormality in at least one of the current sensors 30 and 32 with high accuracy.

Each of the first to fourteenth embodiments can be modified in the following manners.

Methods for calculating the gradient SL(n) based on two pairs of measured values of a pair of current sensors at respective different two measuring (sampling) timings are not limited to those described in the respective first to fifth embodiments. For example, the gradient SL(n) can be calculated based on two pairs of measured values of the paired current sensors; these two pairs of measured values of the paired current sensors are temporally away from each other by two or more measuring (sampling) timings.

The averaged gradient to be calculated based an a plurality of sequential pairs of measured values of a pair of current sensors is not limited to that described in the third embodiment or the sixth embodiment. For example, the control system according to the third embodiment can calculate the averaged gradient based on at least four pairs of measured values of the current sensors 30a and 30b at the respective four measuring timings.

In each of the eighth to tenth embodiments, the gradient of the simple regression line or the vertical-axis intercept thereof can be used to diagnose whether there is an abnormality in at least one of the current sensors 30a and 30b.

In the seventh embodiment, the controller 20 calculates, as a parameter used to diagnose whether there is an offset abnormality in at least one of the current sensors 30a and 30b, the distance between a point of the measured values iua(n) and iub(n) sampled from the respective current sensors 30a and 30b at the present cycle (n) and a line with the gradient of 1, but the present invention is not limited to the calculation.

Specifically, as the first modification of the present invention, the controller 20 can calculate, as a parameter used to diagnose whether there is an offset abnormality in at least one of the current sensors 30a and 30b, a physical amount correlated with the relationship between the point of the measured values iua(n) and iub(n) sampled from the respective current sensors 30a and 30b and the line. For example, the controller 20 can calculate, as a parameter used to diagnose whether there is an offset abnormality in at least one of the current sensors 30a and 30b, the area generated by the point of the measured values iua(n) and iub(n) sampled from the respective current sensors 30a and 30b and a part of the line.

Note that the control system according to the seventh embodiment can carry out, in addition to the offset-abnormality diagnostic routine, another diagnostic routine except for the abnormal diagnostic routine according to the first embodiment.

The state quantities of the motor-generator 10 for variably determining the coordinates of the paired focal points F1 (U1, V1) and F2 (U2, V2) are not limited to the torque T and the angular velocity ω. For example, an input voltage to the inverter IV, an input current to the inverter IV, and/or input power to the inverter IV can be used as the state quantities of the motor-generator 10.

Methods for compensating the change in the size of the ellipse according to the state quantities of the motor-generator 10 are not limited to the method for variably determining the paired focal points F1 (U1, V1) and F2 (U2, V2) set forth above. Specifically, a method for correcting the measured values iua and iub of the current sensors 30a and 30b according to the state quantities of the motor-generator 10 can be used as one of the methods for compensating the change in the size of the ellipse according to the state quantities of the motor-generator 10.

The current sensors 30a and 30b or the current sensors 32a and 32b for measuring a current flowing through a corresponding one phase winding are used as a plurality of sensors each for measuring a physical quantity of a same target, in other words, a plurality of sensors each of which is estimated to output a same measured value sensitive to a same physical quantity, but the present invention is not limited to the sensors.

Specifically, as the second modification of the present invention, a plurality of voltage sensors for measuring an input voltage to the inverter IV or a plurality of sensors for measuring a position of an electronically-controlled throttle valve can be used as a plurality of sensors each for measuring a physical quantity of a same target.

In the seventh embodiment, the control system CS carries out the offset-abnormality diagnosing task if it is determined that there are no amplitude-shift abnormalities (gain abnormalities) in each of the current sensors 30a and 30b, but the present invention is not limited thereto.

Specifically, as the third modification of the present invention, the control system can independently carry out the gain-abnormality diagnosing task based on the routine illustrated in FIG. 3 and the offset-abnormality diagnosing task based on the routine illustrated in FIG. 13. In this case, the operations illustrated in FIG. 13 cannot directly identify an offset-abnormality.

The abnormality-diagnosis preventing task according to the ninth embodiment is applied to the abnormality-diagnosing task using the simple regression analysis, but the present invention is not limited to the application. Specifically, as the fourth modification of the present invention, the abnormality-diagnosis preventing task according to the ninth embodiment can be effectively applied to a plurality of abnormality-diagnosing tasks each using a line as the trajectory of at least one pair of measured values of current sensors for a same phase current.

Three or more current sensors for measuring a same phase current can be used as a plurality of sensors each for measuring a physical quantity of a same target. For example, the control system can diagnose whether there is an abnormality in at least one of three current sensors for measuring a same phase current based on a reference trajectory and the trajectory of a plurality of sets of measured values of the three current sensors in a three-dimensional coordinate system whose first, second, and third axes respectively represent the measured values of one of the three current sensors, the measured values of another one of the three current sensors, and the measured values of the last current sensor.

A plurality of sequential pairs of measured values of the current sensors 30a and 30b are used to calculate the gradient SL(n) according to the first embodiment, but the present invention is not limited thereto.

For example, an abnormal diagnosis routine to be executed by the controller 20 according to the fifth modification of the present invention will be described hereinafter with reference to FIG. 25 in place of FIG. 3. In FIG. 25, like operations between the routines in FIGS. 3 and 25, to which like numbered steps are assigned, are omitted in description. The controller 20 repeatedly executes the abnormal diagnosis routine in a preset cycle, such as in a cycle of a preset electric angle.

When launching the abnormal diagnosis routine at a present cycle (n), the controller 20 carries out the sampling operation in step S20 set forth above.

Next, the controller 20 calculates a gradient SL(n) of a line passing through one pair of the measured values iua(n) and iub(n) sampled from the respective current sensors 30a and 30b at the present cycle (n) and a previously defined point (ia, ib) in the two-dimensional coordinate system in step S12c.

Specifically, in step S12c, the controller 20 calculates the gradient SL(n) of the line in the following equation:

$$SL(n) = \frac{iub(n) - ib}{iua(n) - ia}$$

Thus, if the deviation of the gradient SL(n) from "1" is equal to or smaller than the threshold value δ (YES in step S12c), the controller 20 diagnoses that there are no abnormalities in each of the current sensors 30a and 30b in step S14. In other words, the controller 20 determines that each of the current sensors 30a and 30b is a normal current sensor in step S14.

Otherwise, if the deviation of the gradient SL(n) from "1" is greater than the threshold value δ (NO in step S12c), the controller 20 diagnoses that there is an abnormality in at least one of the current sensors 30a and 30b in step S16.

In step S12c, the controller 20 can determine whether there is an abnormality in at least one of the current sensors 30a and 30b based on the degree of the divergence between: a vertical-axis intercept of a line with the gradient of 1 passing through one pair of the measured values iua(n) and iub(n) sampled from the respective current sensors, 30a and 30b at the present cycle (n), and a normal vertical intercept of 0.

Specifically, if the deviation of the vertical-axis intercept of the line from the normal vertical-axis intercept of 0 is within an allowable range (YES in step S12c), the controller 20 diagnoses that there are no abnormalities in each of the current sensors 30a and 30b in step S14. In other words, the controller 20 determines that each of the current sensors 30a and 30b is a normal current sensor in step S14.

Otherwise, if the deviation of the vertical-axis intercept of the line from the normal vertical-axis intercept of 0 is out of the allowable range (NO in step S12c), the controller 20 diagnoses that there is an abnormality in at least one of the current sensors 30a and 30b in step S16.

In step S12c, in place of the vertical-axis intercept, the horizontal-axis intercept can be used.

While illustrative embodiments of the invention have been described herein, the present invention is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be constructed as non-exclusive.

What is claimed is:

1. An abnormality diagnosing system for a plurality of different current sensors for measuring current flowing in a rotary machine, the abnormality diagnosing system comprising:
    an obtaining means that obtains at least one pair of measured values of at least two current sensors in the plurality of current sensors, the at least one pair of measured values being measured by the at least two current sensors at a substantially same timing; and
    a diagnosing means that diagnoses whether there is an abnormality in the at least two current sensors based on a comparison between a reference trajectory and a trajectory drawn by the at least one pair of measured values obtained by the obtaining means in a coordinate system with coordinate axes, the coordinate axes representing the measured values of the at least two current sensors, respectively.

2. The abnormality diagnosing system according to claim 1, wherein the at least one pair of measured values of the at least two current sensors is a plurality of pairs of measured values of the at least two current sensors, each pair of the plurality of pairs of measured values being measured by the at least two current sensors at a substantially same timing, and the trajectory drawn by the at least one pair of measured values obtained by the obtaining means is drawn by the plurality of pairs of measured values of the at least two current sensors obtained by the obtaining means.

3. The abnormality diagnosing system according to claim 2, wherein the rotary machine is a multiphase rotary machine, the current flows in the multiphase rotary machine as one-phase current, and the diagnosing means diagnoses whether there is an abnormality in the at least two current sensors based on the trajectory drawn by the plurality of pairs of measured values of the respective at least two sensors obtained by the obtaining means.

4. The abnormality diagnosing system according to claim 3, wherein the diagnosing means diagnoses whether there is an abnormality in the at least two current sensors in the plurality of current sensors using a gradient of the trajectory defined by the plurality of pairs of measured values of the respective at least two sensors obtained by the obtaining means.

5. The abnormality diagnosing system according to claim 4, wherein the gradient of the trajectory is a gradient of a line defined by the plurality of pairs of measured values of the respective at least two sensors obtained by the obtaining means.

6. The abnormality diagnosing system according to claim 5, wherein the plurality of pairs of measured values are a plurality of sequential pairs of measured values of the at least two current sensors in the plurality of current sensors, and the line is defined by connecting one pair in the plurality of sequential pairs of measured values and an alternative one pair in the plurality of sequential pairs of measured values, the one pair and the alternative one pair being adjacent to each other.

7. The abnormality diagnosing system according to claim 5, wherein the plurality of pairs of measured values are a plurality of sequential pairs of measured values of the at least two current sensors in the plurality of current sensors, and the line is defined by connecting one pair in the plurality of sequential pairs of measured values and an alternative one pair in the plurality of sequential pairs of measured values, the one pair and the alternative one pair being nonadjacent to each other.

8. The abnormality diagnosing system according to claim 4, wherein the diagnosing means is configured to calculate the gradient of the line in accordance with a ratio of change in the measured values of one of the at least two current sensors to change in the measured values of the other thereof, and the diagnosing means further comprises a stop means that stops calculation of the gradient of the line if a denominator of the ratio is zero in calculation of the gradient.

9. The abnormality diagnosing system according to claim 5, wherein the gradient of the line is an average gradient calculated from at least three pairs of the plurality of pairs of measured values.

10. The abnormality diagnosing system according to claim 3, wherein the diagnosing means calculates the trajectory of the plurality of pairs of measured values for diagnosing whether there is an abnormality in the at least two current sensors for the one-phase as a simple regression line, and diagnoses whether there is an abnormality in the at least two current sensors based on a divergence between the simple regression line and a reference line as the reference trajectory.

11. The abnormality diagnosing system according to claim 10, wherein the diagnosing means is configured to calculate the simple regression line such that the simple regression line passes through a point; this point corresponds to a large current that is estimated to be unmeasured by the at least two current sensors for the one-phase.

12. The abnormality diagnosing system according to claim 4, further comprising:
a preventing means that prevents the diagnosing means from diagnosing that there is an abnormality if an amplitude of the current flowing in the multiphase rotary machine is equal to or lower than a preset threshold.

13. The abnormality diagnosing system according to claim 3, wherein the reference trajectory is a reference line estimated if the at least two current sensors are normal, and the diagnosing means diagnoses whether there is an abnormality in the at least two current sensors based on a distance between a pair of the plurality of pairs of measured values and the reference line.

14. The abnormality diagnosing system according to claim 1, wherein the rotary machine is a multiphase rotary machine, the at least one pair of measured values of the at least two current sensors being a plurality of pairs of measured values of the at least two current sensors, the current flows in the multiphase rotary machine as one-phase current, and the diagnosing means diagnoses whether there is an abnormality in the at least two current sensors based on a point at which a line and the coordinate axes intersect with each other, the line being defined by the plurality of pairs of measured values of the plurality of current sensors and a predetermined gradient.

15. The abnormality diagnosing system according to claim 2, wherein the diagnosing means diagnoses whether there is an abnormality in the at least two current sensors in the plurality of current sensors based on an angle between a first gradient of the trajectory of one pair of the plurality of pairs of measured values of the at least two current sensors and a second gradient of the trajectory of an alternative pair of the plurality of pairs of measured values of the at least two current sensors, the first gradient and the second gradient being sequentially adjacent to each other.

16. The abnormality diagnosing system according to claim 2, wherein the reference trajectory is an elliptical trajectory drawn by the at least two current sensors if the at least two current sensors have a phase shift therebetween, and the diagnosing means diagnoses whether there is an abnormality in the at least two current sensors based on values of a gradient defined by the plurality of pairs of measured values of the at least two current sensors, the values of the gradient being within a preset period.

17. The abnormality diagnosing system according to claim 2, wherein the rotary machine is a multiphase rotary machine, the at least two current sensors measure currents flowing in different phases of the multiphase rotary machine, and the trajectory is an elliptical trajectory drawn by the at least two current sensors if the at least two current sensors have a phase shift therebetween.

18. The abnormality diagnosing system according to claim 17, wherein the diagnosing means diagnoses whether there is an abnormality in the at least two current sensors based on a sum of one distance between one point and one pair of the plurality of pairs of measured values of the at least two current sensors and another distance between another point and the one pair of the plurality of pairs of measured values of the at least two current sensors.

19. The abnormality diagnosing system according to claim 18, wherein the elliptical trajectory as the reference trajectory is determined based on the phase shift, and a size of the elliptical trajectory is determined according to a state quantity of the multiphase rotary machine.

20. An abnormality diagnosing system for a plurality of sensors for measuring a physical quantity of a common target, the abnormality diagnosing system comprising:
an obtaining means that obtains at least one pair of measured values of at least two sensors in the plurality of sensors, the measured values being measured by the at least two sensors at a substantially same timing; and
a diagnosing means that diagnoses whether there is an abnormality in the at least two sensors based on a comparison between a reference trajectory and a trajectory drawn by the measured values obtained by the obtaining means in a coordinate system with coordinate axes, the coordinate axes representing the measured values of the at least two sensors, respectively.

21. The abnormality diagnosing system according to claim 20, wherein the at least one pair of measured values of the at least two sensors is a plurality of pairs of measured values of the at least two sensors, the diagnosing means diagnoses whether there is an abnormality in the at least two sensors in the plurality of sensors using a gradient of a line that is the trajectory defined by the plurality of pairs of measured values of the respective at least two sensors obtained by the obtaining means.

22. The abnormality diagnosing system according to claim 21, wherein the plurality of pairs of measured values are a plurality of sequential pairs of measured values of the at least two sensors in the plurality of sensors, and the line is defined by connecting one pair in the plurality of sequential pairs of measured values and an alternative one pair in the plurality of sequential pairs of measured values, the one pair and the alternative one pair being adjacent to each other.

23. The abnormality diagnosing system according to claim 21, wherein the plurality of pairs of measured values are a plurality of sequential pairs of measured values of the at least two sensors in the plurality of sensors, and the line is defined by connecting one pair in the plurality of sequential pairs of measured values and an alternative one pair in the plurality of sequential pairs of measured values, the one pair and the alternative one pair being nonadjacent to each other.

24. The abnormality diagnosing system according to claim 21, wherein the diagnosing means is configured to calculate the gradient of the line in accordance with a ratio of change in the measured values of one of the at least two sensors to change in the measured values of the other thereof, and the diagnosing means further comprises a stop means that stops calculation of the gradient of the line if a denominator of the ratio is zero in calculation of the gradient.

25. The abnormality diagnosing system according to claim 21, wherein the gradient of the line is an average gradient calculated from at least three pairs of the plurality of pairs of measured values.

26. The abnormality diagnosing system according to claim 21, wherein the diagnosing means calculates the trajectory of the plurality of pairs of measured values for diagnosing whether there is an abnormality in the at least two sensors as a simple regression line, and diagnoses whether there is an abnormality in the at least two sensors based on a divergence between the simple regression line and a reference line as the reference trajectory.

27. The abnormality diagnosing system according to claim 26, wherein the simple regression line is calculated as a line passing through a point; this point corresponds to a large current that is estimated to be unmeasured by the at least two sensors.

28. The abnormality diagnosing system according to claim 21, wherein the reference trajectory is a reference line estimated if the at least two sensors are normal, and the diagnosing means diagnoses whether there is an abnormality in the at least two sensors based on a distance between a pair of the plurality of pairs of measured values and the reference line.

29. The abnormality diagnosing system according to claim 20, wherein the at least one pair of measured values of the at least two sensors is a plurality of pairs of measured values of the at least two sensors, and the diagnosing means diagnoses whether there is an abnormality in the at least two sensors based on a point at which a line and the coordinate axes intersect with each other, the line being defined based on the plurality of pairs of measured values of the plurality of sensors and a predetermined gradient.

30. The abnormality diagnosing system according to claim 20, wherein the at least one pair of measured values of the at least two sensors is a plurality of pairs of measured values of the at least two sensors, and the diagnosing means diagnoses whether there is an abnormality in the plurality of sensors based on an angle between a first gradient of the trajectory of one pair of the plurality of pairs of measured values of the at least two sensors and a second gradient of the trajectory of an alternative pair of the plurality of pairs of measured values of the at least two sensors, the first gradient and the second gradient being sequentially adjacent to each other.

31. The abnormality diagnosing system according to claim 20, wherein the at least one pair of measured values of the at least two sensors is a plurality of pairs of measured values of the at least two sensors, the reference trajectory is an elliptical trajectory drawn by the at least two sensors if the at least two sensors have a phase shift therebetween, and the diagnosing means diagnoses whether there is an abnormality in the at least two sensors based on values of a gradient defined by the plurality of pairs of measured values of the at least two sensors, the values of the gradient being within a preset period.

* * * * *